(12) United States Patent
Duncan et al.

(10) Patent No.: US 12,532,428 B2
(45) Date of Patent: Jan. 20, 2026

(54) ALL-IN-ONE, END-TO-END, AND EXPANDABLE MODULAR DATA CENTERS

(71) Applicant: Dell Products L.P., Round Rock, TX (US)

(72) Inventors: Tyler Baxter Duncan, Austin, TX (US); Anthony Middleton, Cedar Park, TX (US); Jeffery Todd Sayles, San Marcos, TX (US); Ty Robert Schmitt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 444 days.

(21) Appl. No.: 17/970,340

(22) Filed: Oct. 20, 2022

(65) Prior Publication Data

US 2024/0138084 A1 Apr. 25, 2024
US 2024/0237251 A9 Jul. 11, 2024

(51) Int. Cl.
*H05K 7/14* (2006.01)
*H05K 7/20* (2006.01)

(52) U.S. Cl.
CPC ........... *H05K 7/1431* (2013.01); *H05K 7/202* (2013.01); *H05K 7/20745* (2013.01); *H05K 7/20836* (2013.01)

(58) Field of Classification Search
CPC .... H05K 7/202; H05K 7/1431; H05K 7/1488; H05K 7/1497; H05K 7/20745; H05K 7/20836
USPC ... 361/796, 679.46, 679.32, 679.5, 688, 690
See application file for complete search history.

(56) References Cited

U.S. PATENT DOCUMENTS

| | | | |
|---|---|---|---|
| 5,954,823 A | 9/1999 | Cutts et al. | |
| 8,107,256 B1* | 1/2012 | Kondrat | H05K 7/1429 361/796 |
| 8,917,502 B1* | 12/2014 | Gardner | H05K 7/1497 361/679.5 |
| 9,439,328 B2* | 9/2016 | Bailey | H05K 7/20745 |
| 9,622,373 B1 | 4/2017 | Sarti | |
| 9,943,005 B2* | 4/2018 | Chen | H05K 7/1497 |
| 11,681,266 B2* | 6/2023 | Bailey | G01N 33/0027 700/282 |
| 11,925,003 B2* | 3/2024 | Tunks | H05K 7/20509 |
| 12,306,613 B2* | 5/2025 | Duncan | H05K 7/20836 |
| 12,356,579 B1* | 7/2025 | Welsko | H05K 7/2029 |
| 12,389,562 B2* | 8/2025 | Duncan | H05K 7/1497 |
| 2012/0155027 A1* | 6/2012 | Broome | H05K 7/20745 361/688 |
| 2014/0029196 A1* | 1/2014 | Smith | H05K 7/20836 361/699 |

(Continued)

*Primary Examiner* — Dameon E Levi
(74) *Attorney, Agent, or Firm* — Chamberlain, Hrdlicka, White, Williams & Aughtry; Aly Z. Dossa

(57) ABSTRACT

A modular data center includes: a modular information technology component (MITC), in which the MITC includes an information handling system (IHS) and a utility control component (UCC), in which the IHS and the UCC are affixed to a bottom side of the MITC; and a front access component and a rear access component, in which the front access component is connected to a front side of the MITC, in which an area of the front access component is equal to an area of the front side of the MITC, in which the rear access component is connected to a rear side of the MITC, and in which an area of the rear access component is equal to an area of the rear side of the MITC.

8 Claims, 23 Drawing Sheets

(56) References Cited

U.S. PATENT DOCUMENTS

| | | | |
|---|---|---|---|
| 2015/0177750 A1 | 6/2015 | Bailey et al. | |
| 2017/0253374 A1* | 9/2017 | Tunks | H05K 7/1488 |
| 2017/0359917 A1* | 12/2017 | Bailey | H05K 7/1485 |
| 2019/0332822 A1* | 10/2019 | Shelnutt | G06F 21/6218 |
| 2021/0127523 A1* | 4/2021 | Bailey | H05K 7/1491 |
| 2022/0030744 A1* | 1/2022 | Embleton | H05K 7/20209 |
| 2023/0106634 A1* | 4/2023 | Dunne | E04B 1/34321 |
| | | | 52/79.5 |

* cited by examiner

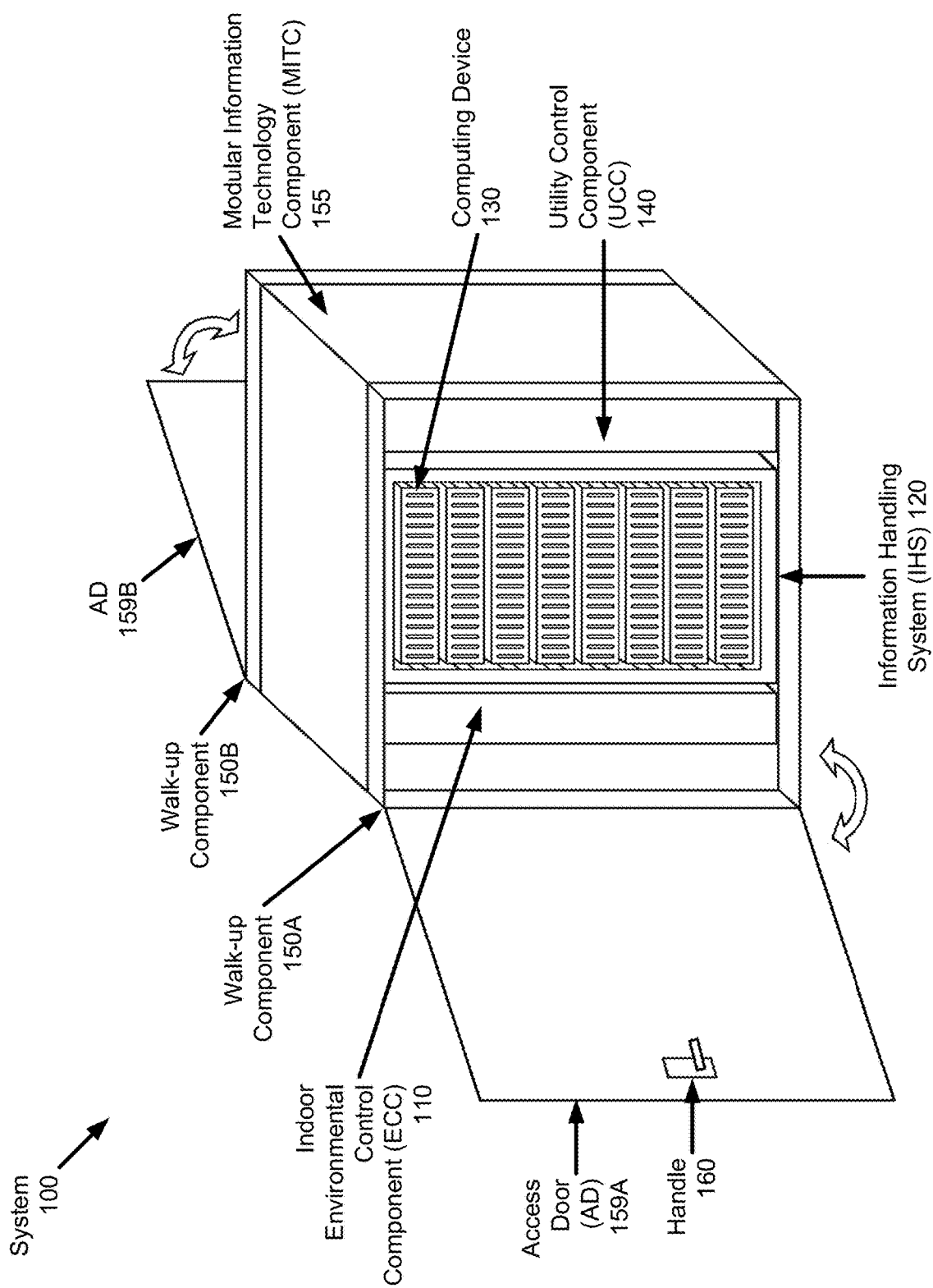
FIG. 1.1

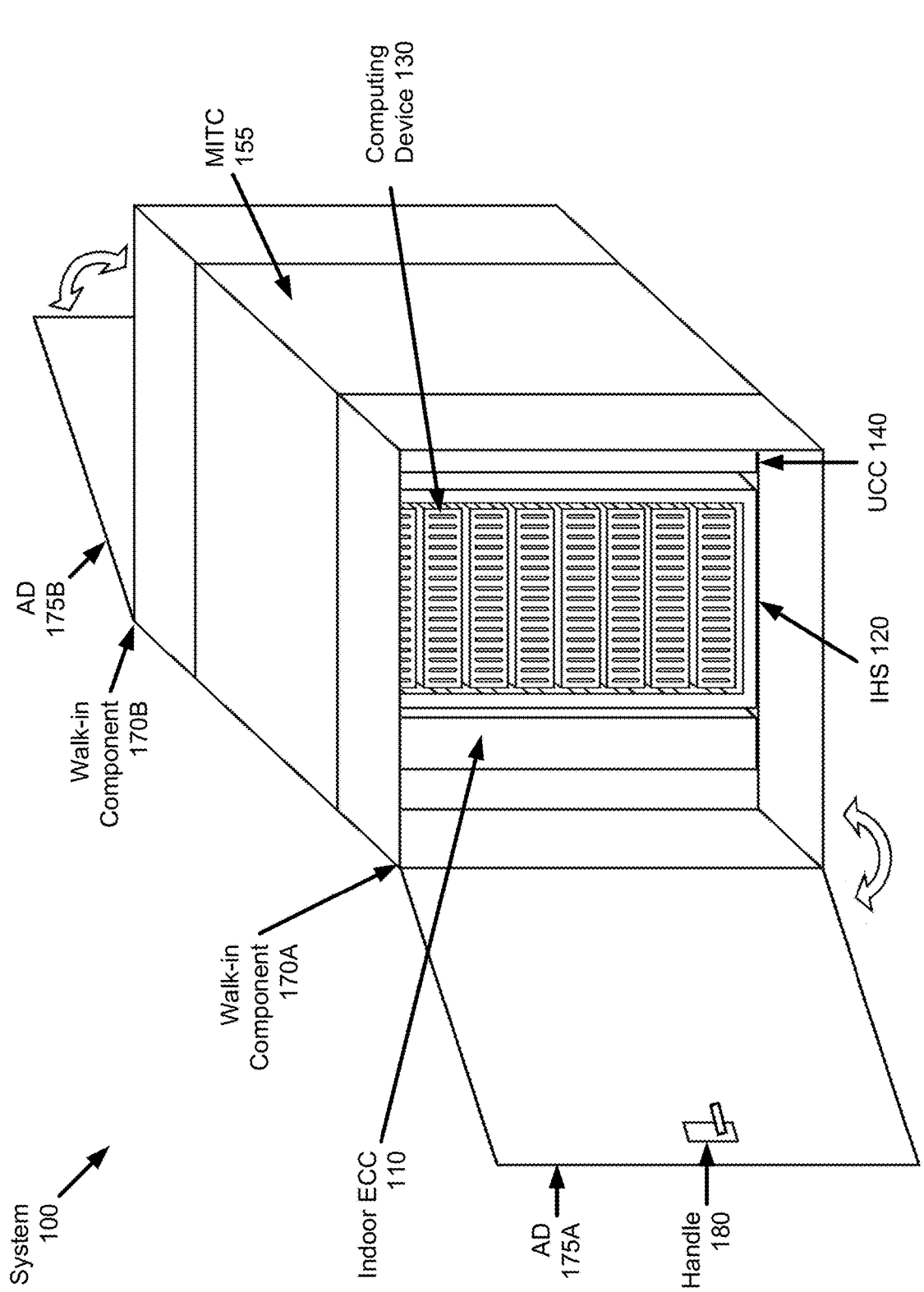
FIG. 1.2

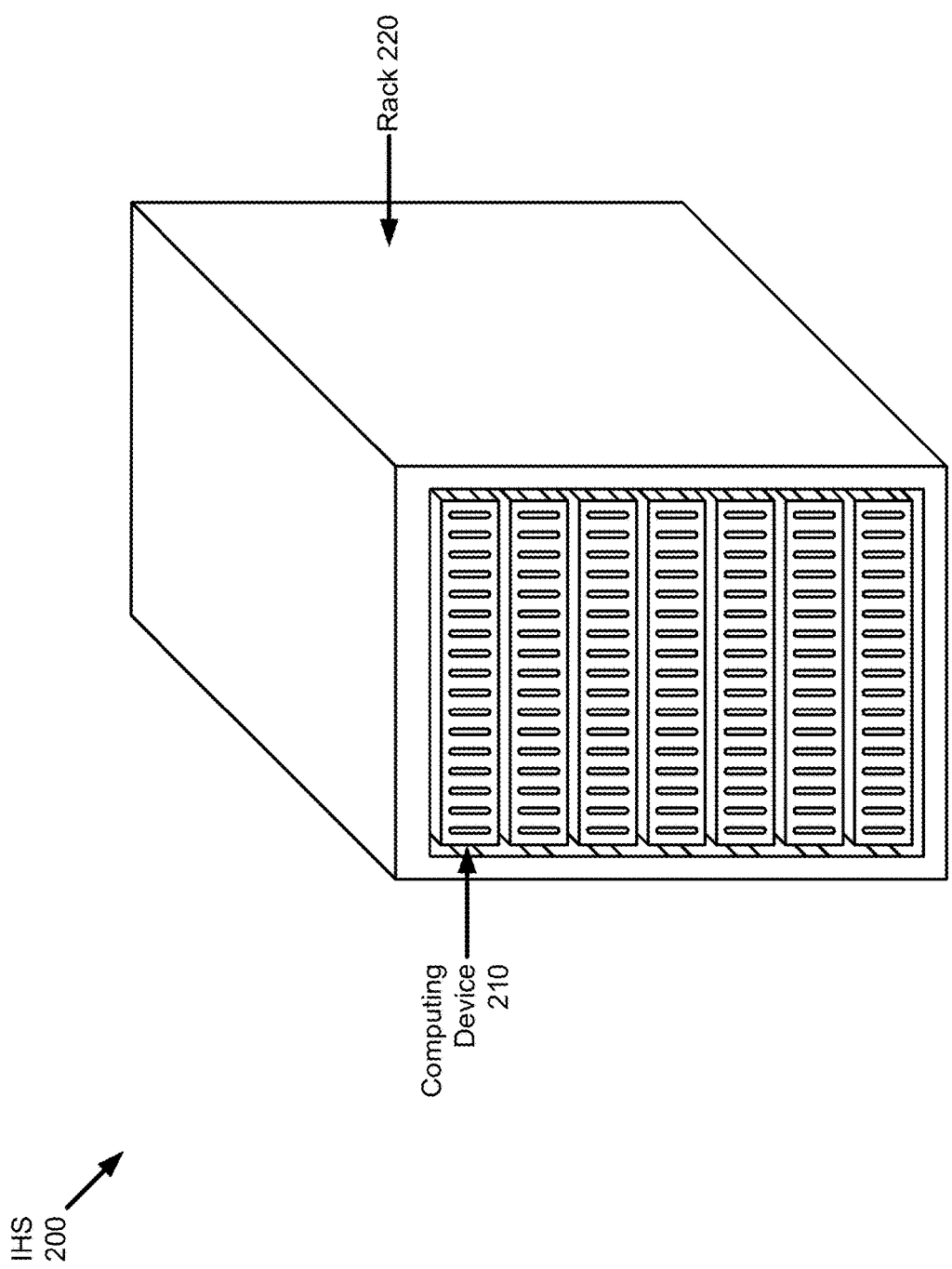
FIG. 2.1

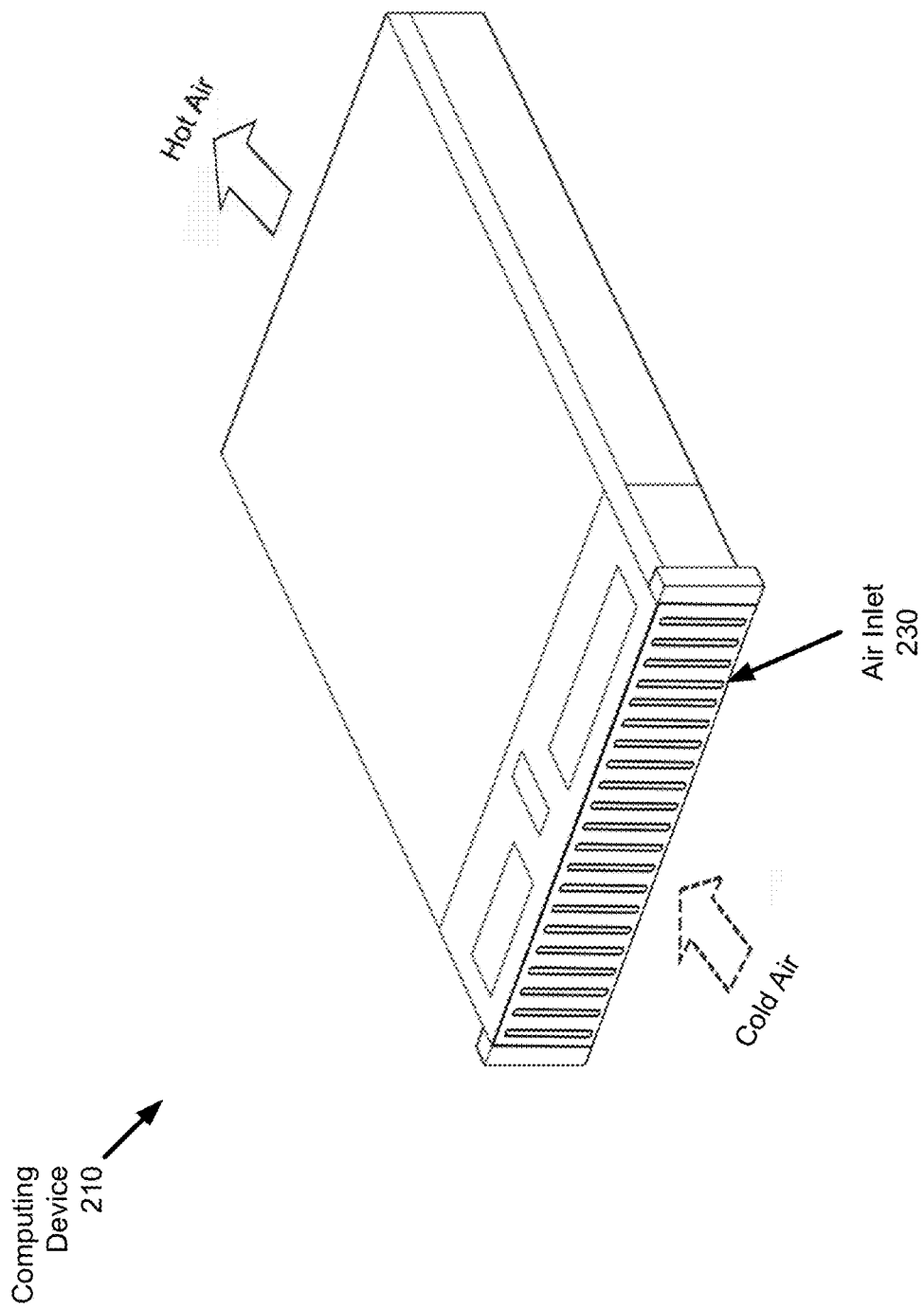
FIG. 2.2

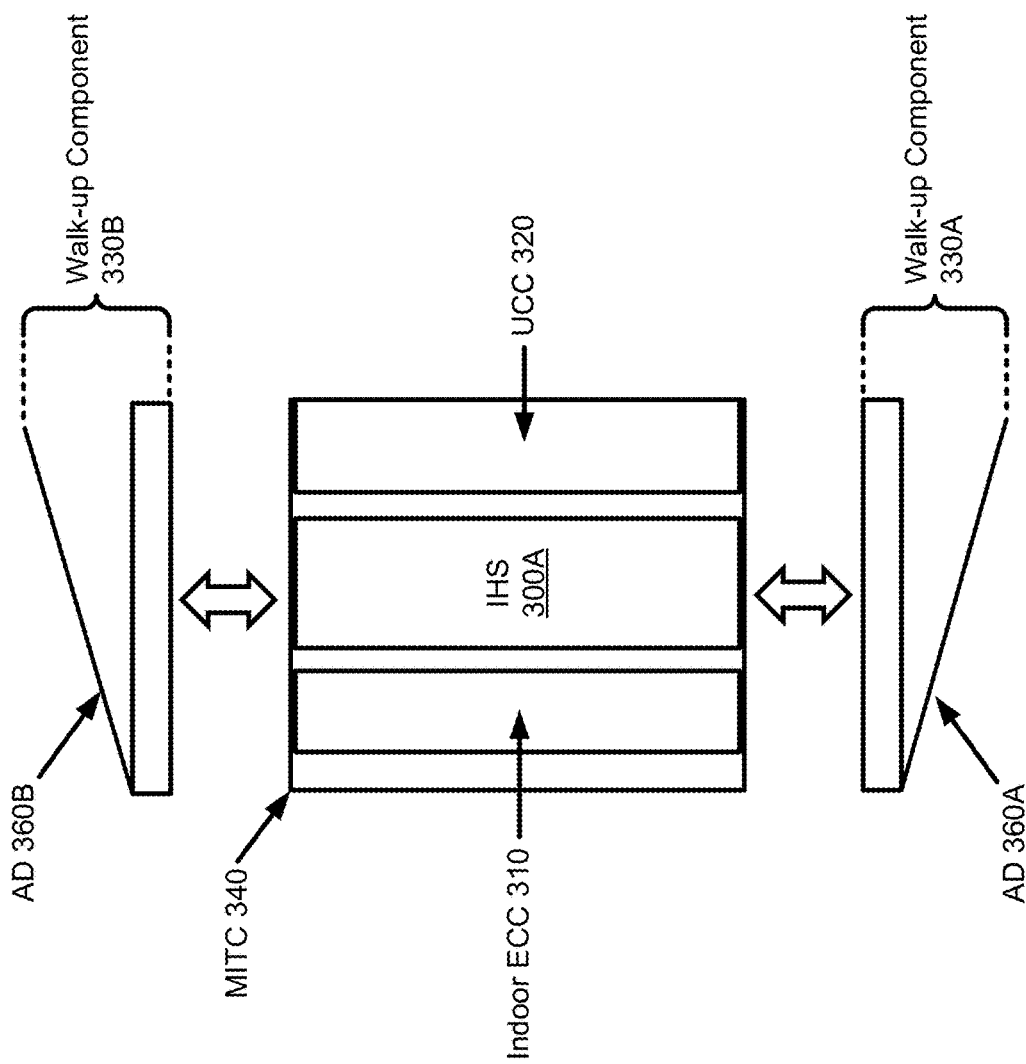
FIG. 3.1

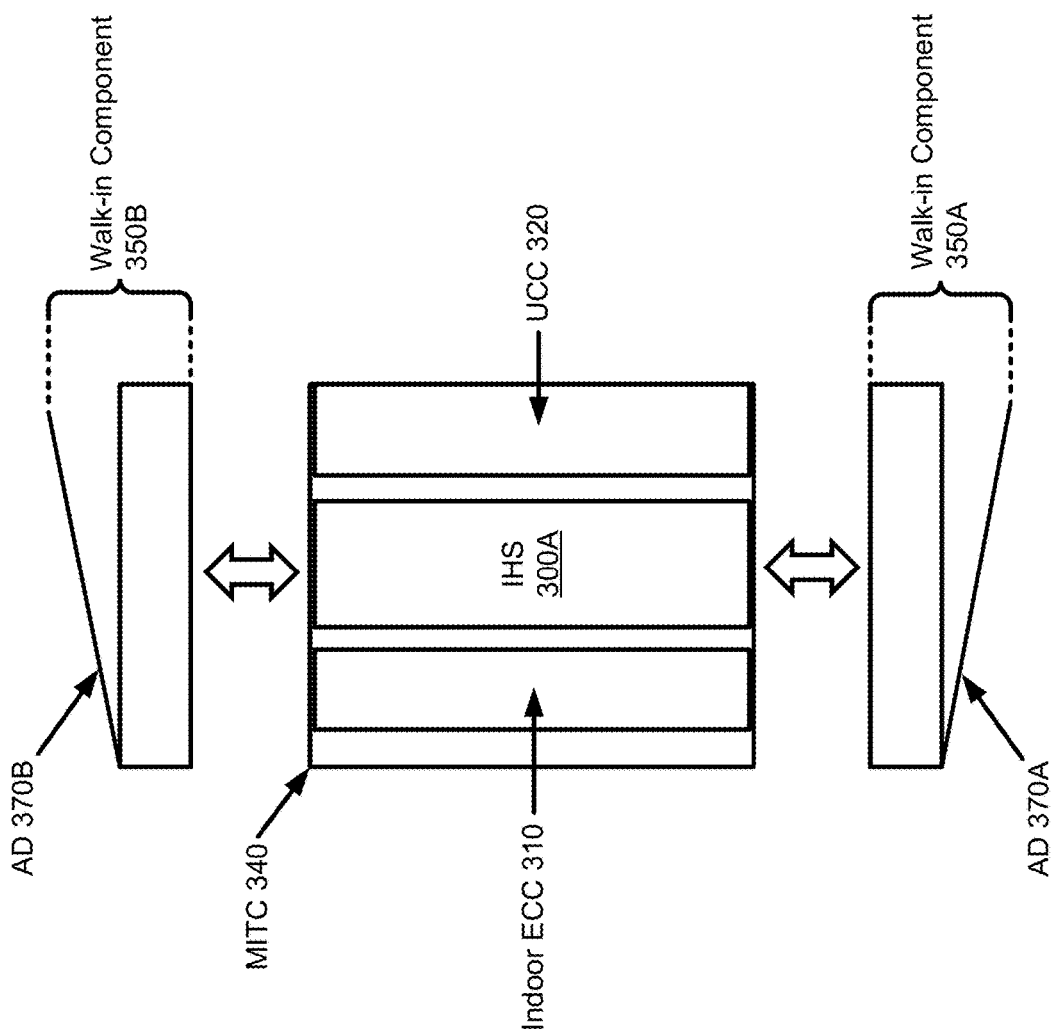
FIG. 3.2

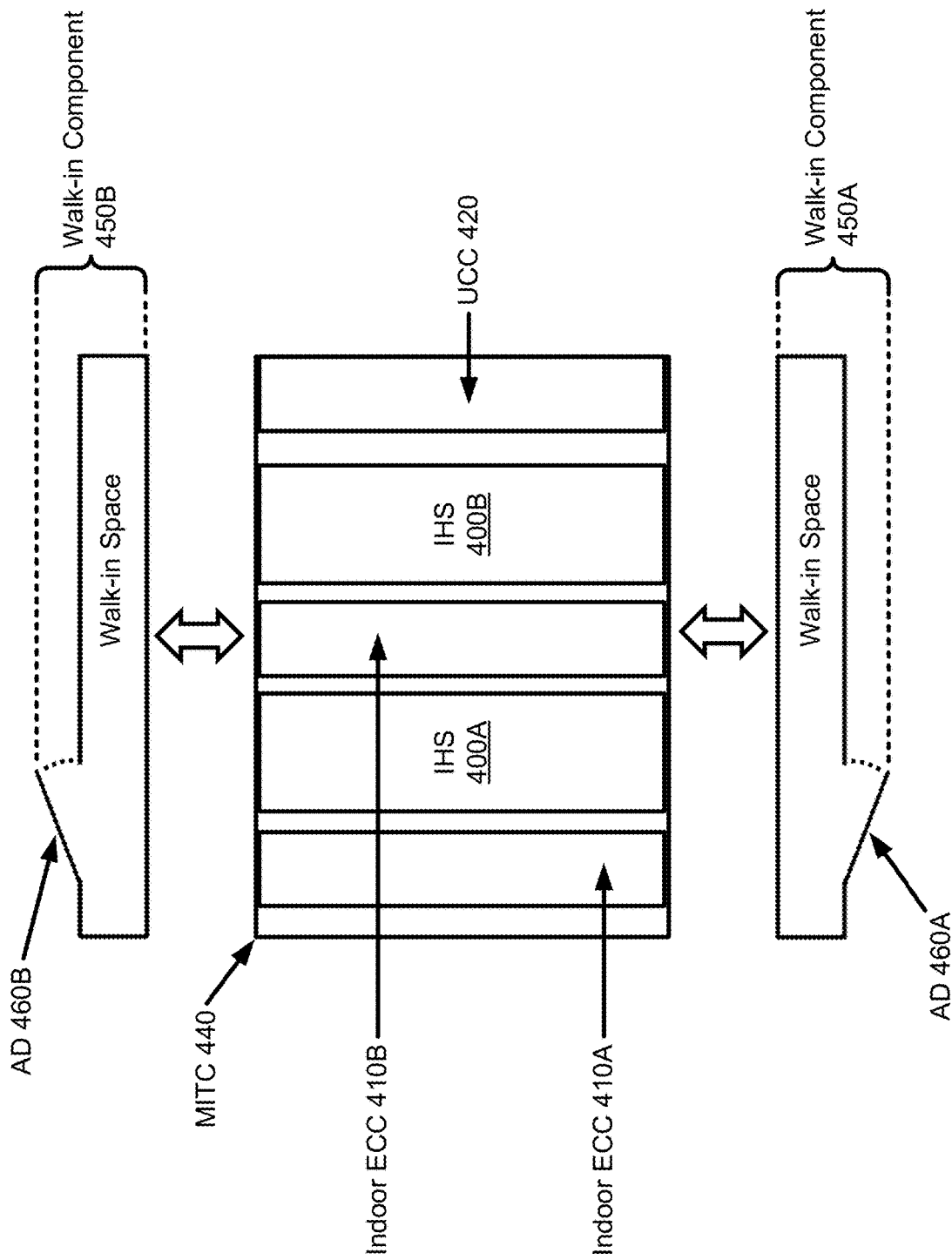
FIG. 4.1

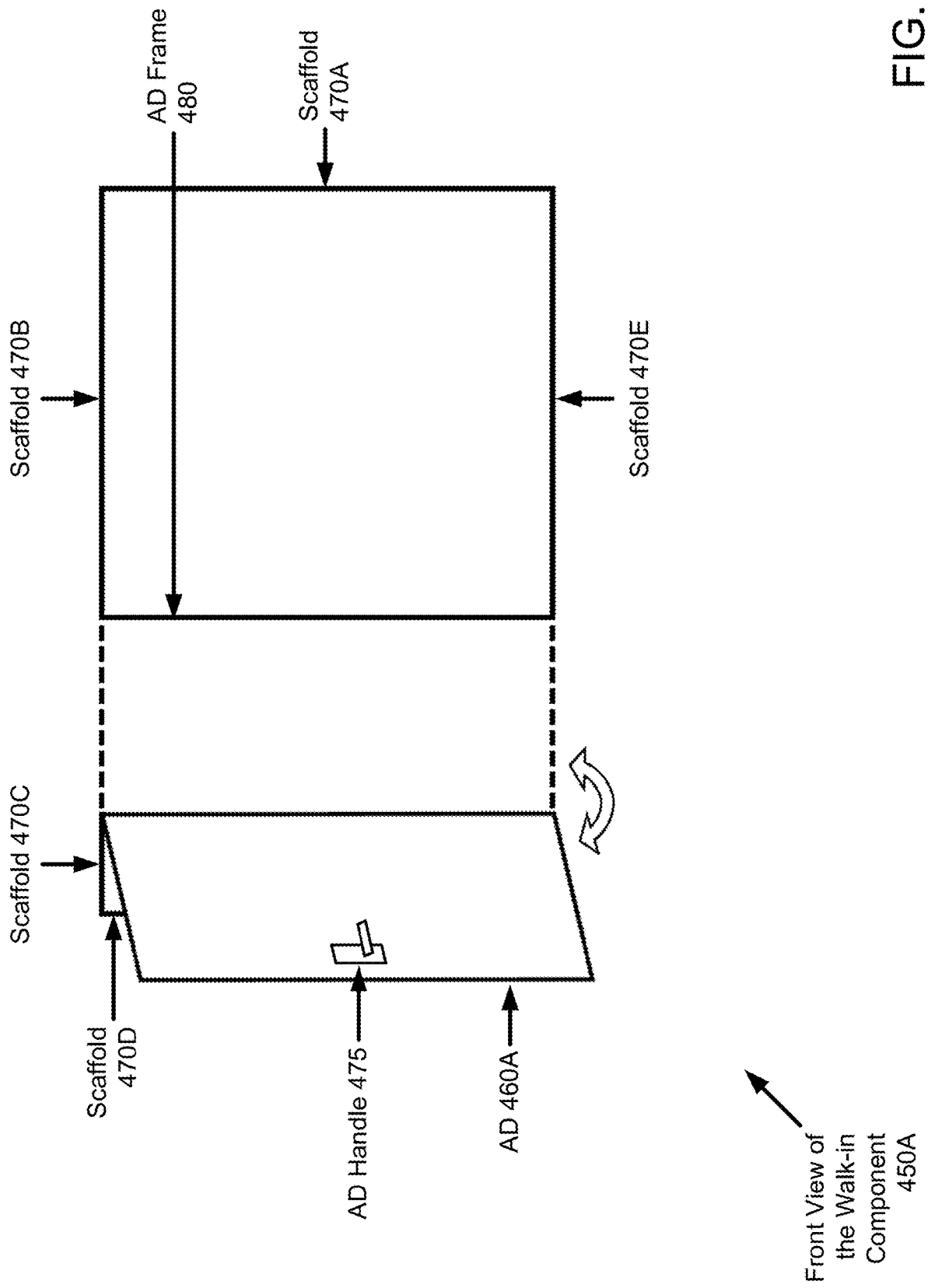
FIG. 4.2

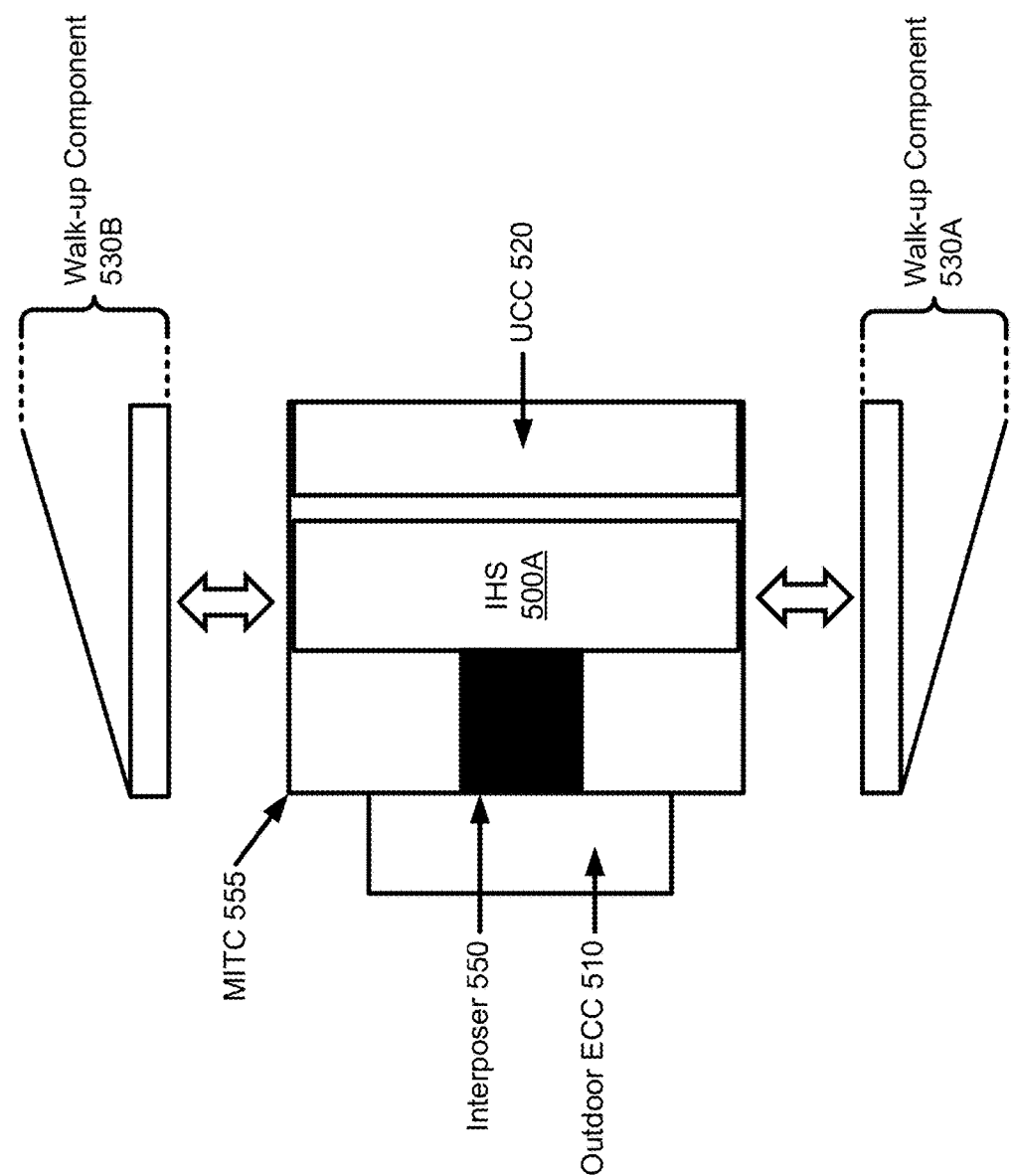
FIG. 5.1

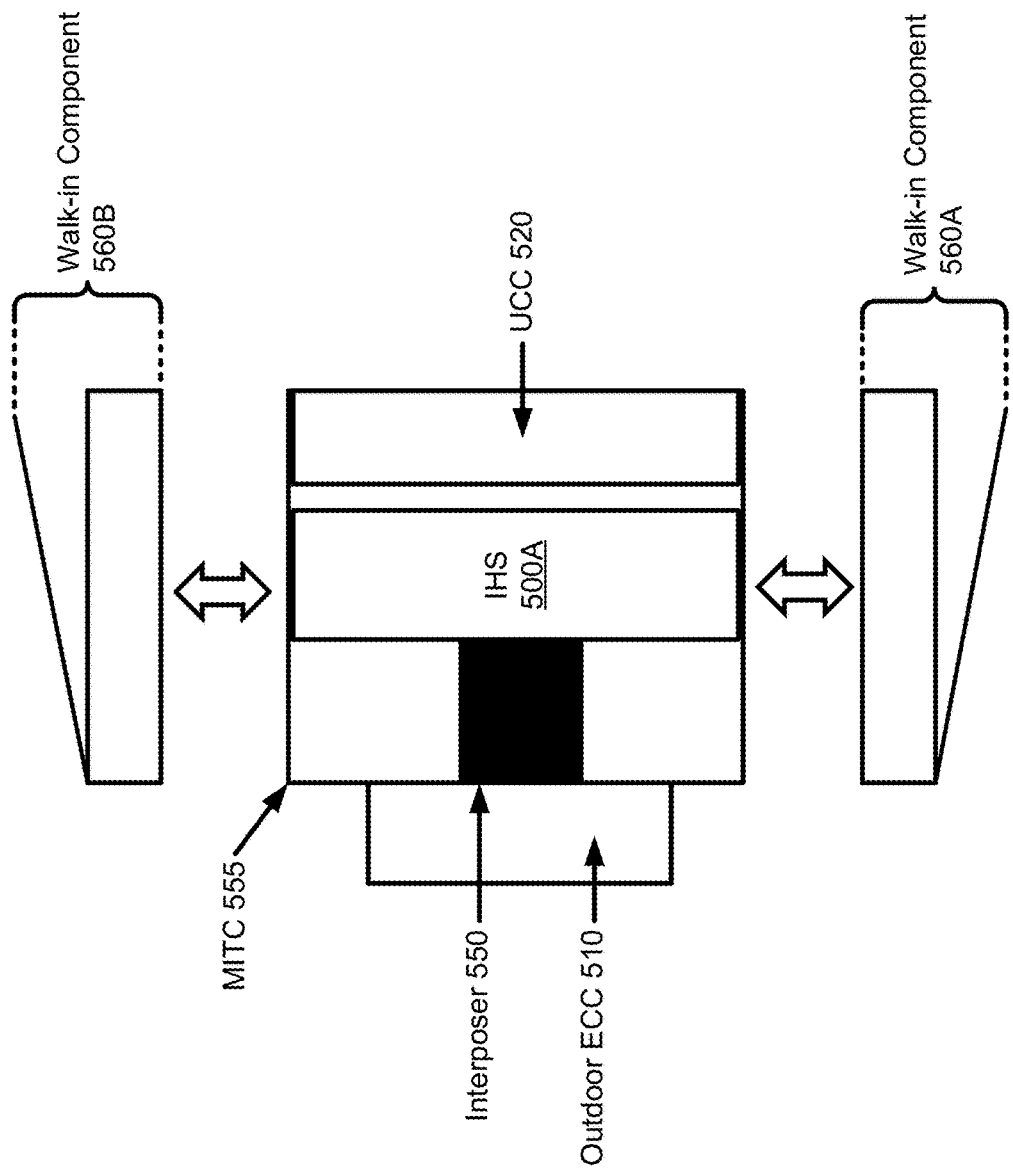
FIG. 5.2

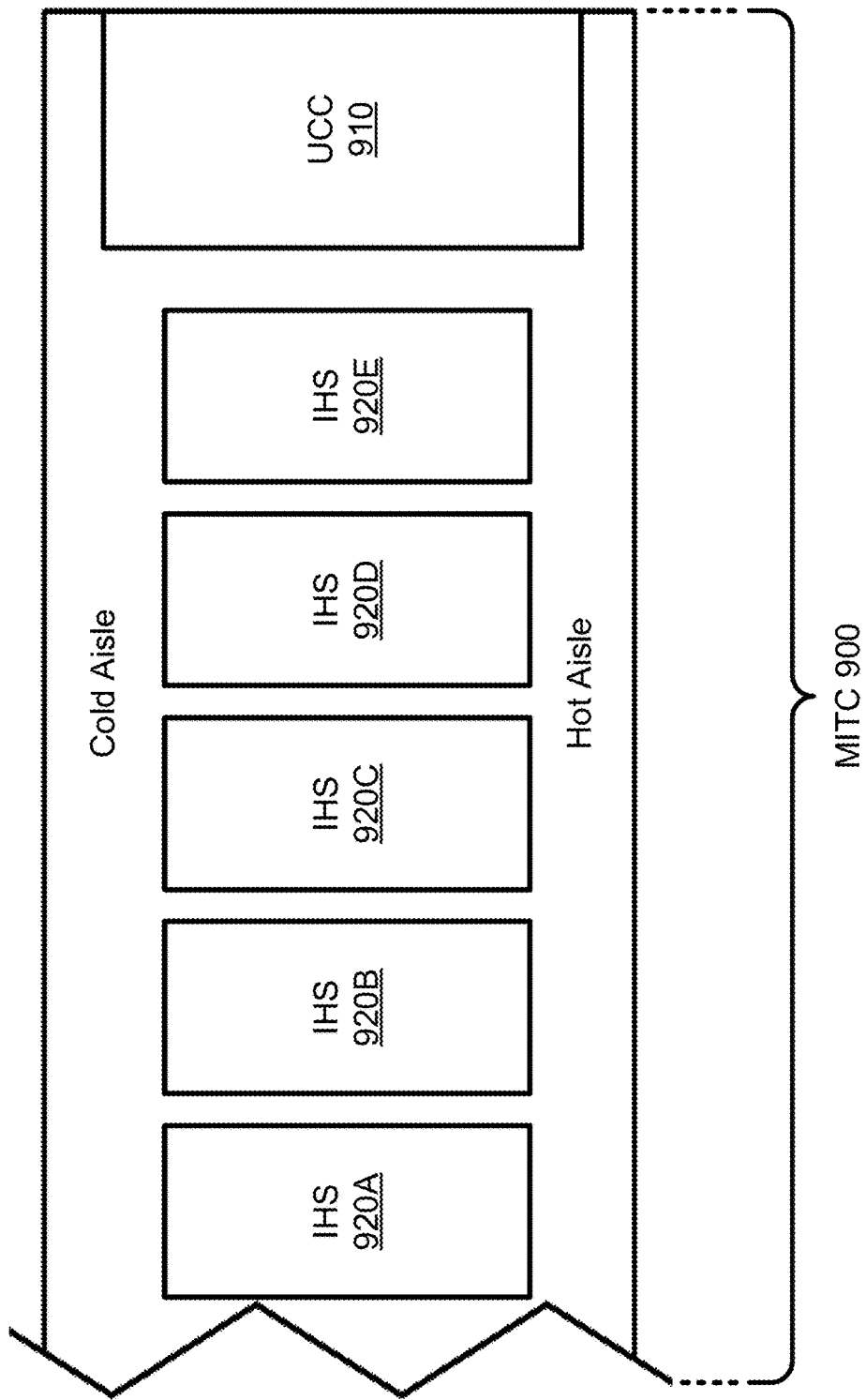
FIG. 9.1

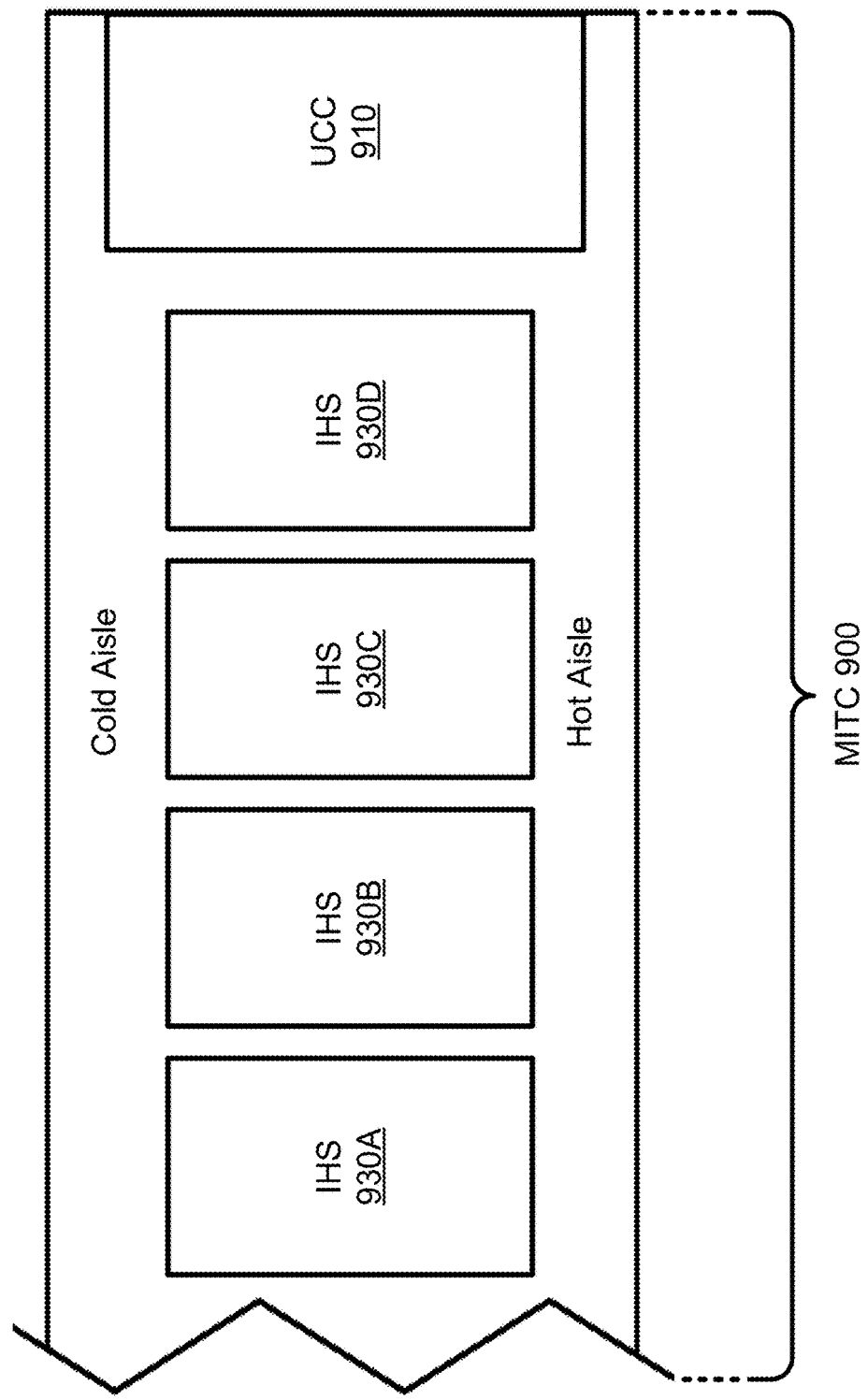
FIG. 9.2

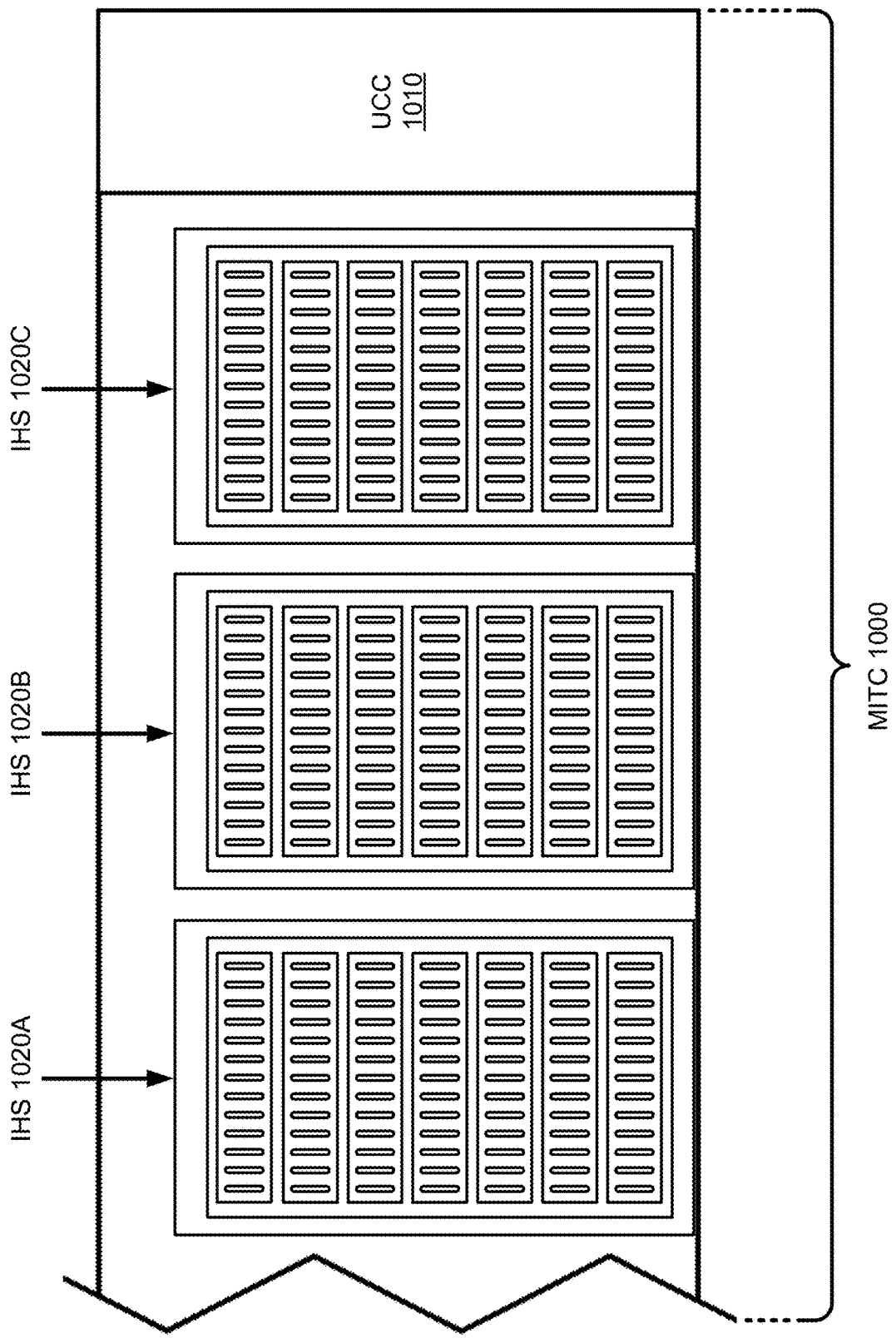
FIG. 10.1

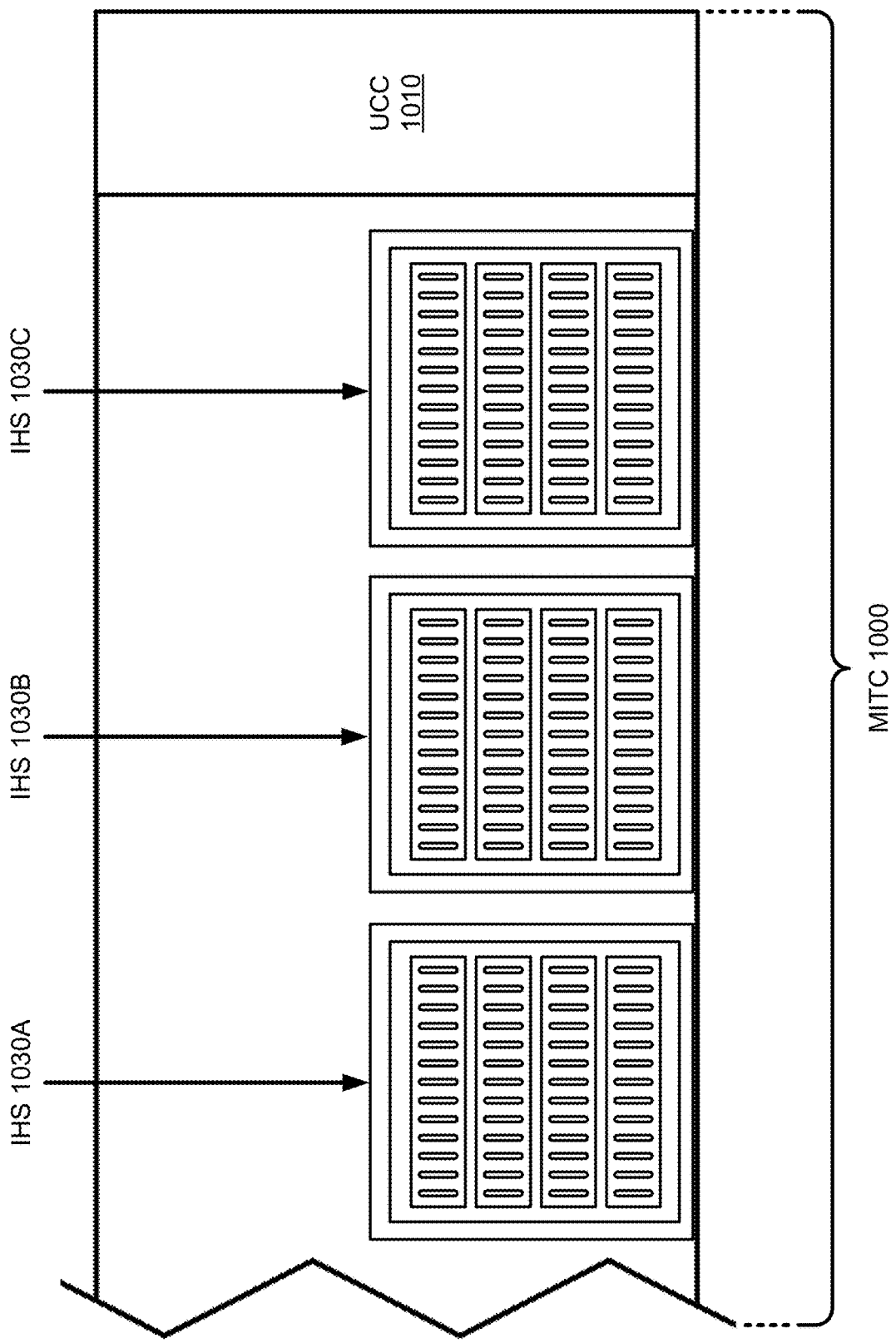
FIG. 10.2

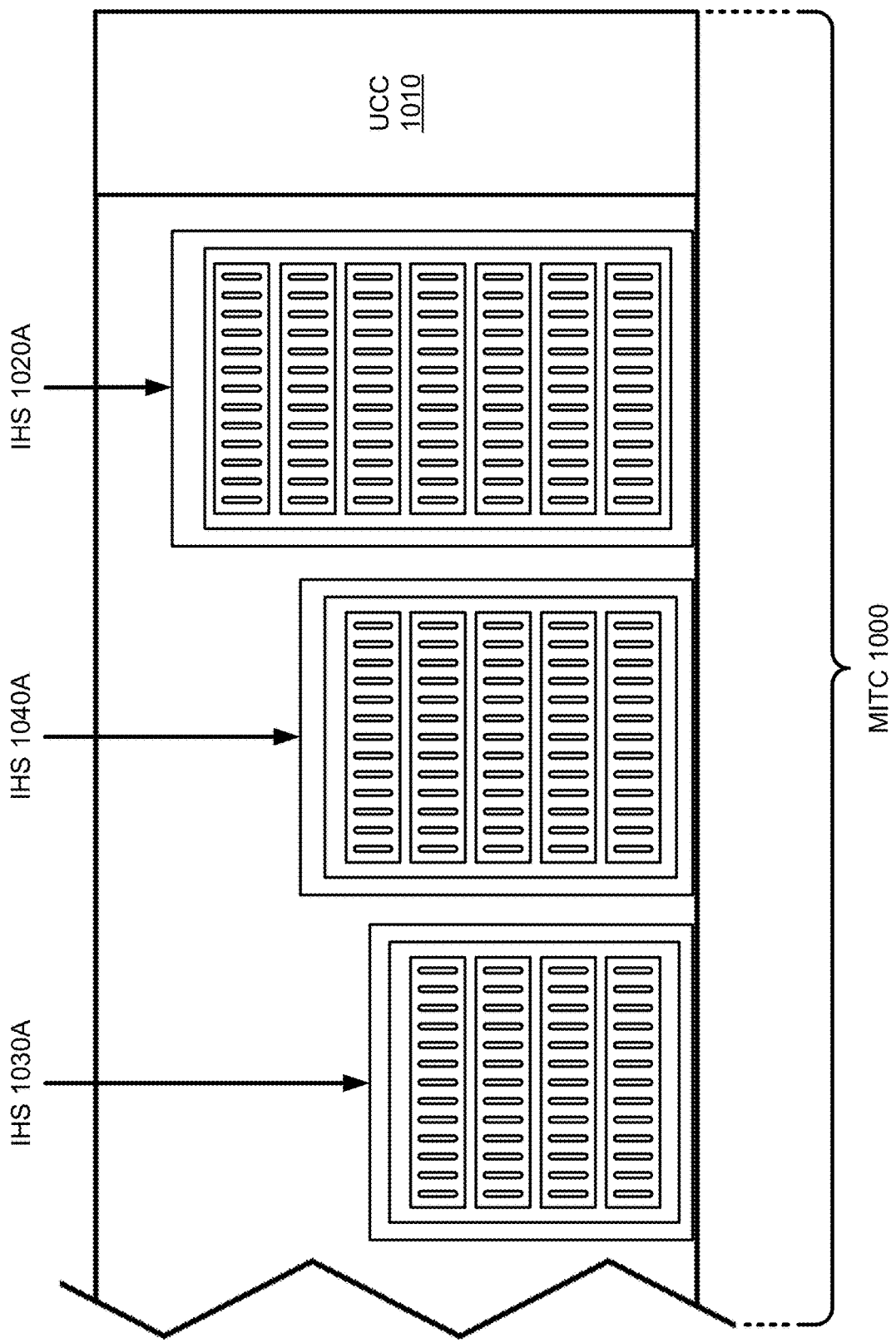
FIG. 10.3

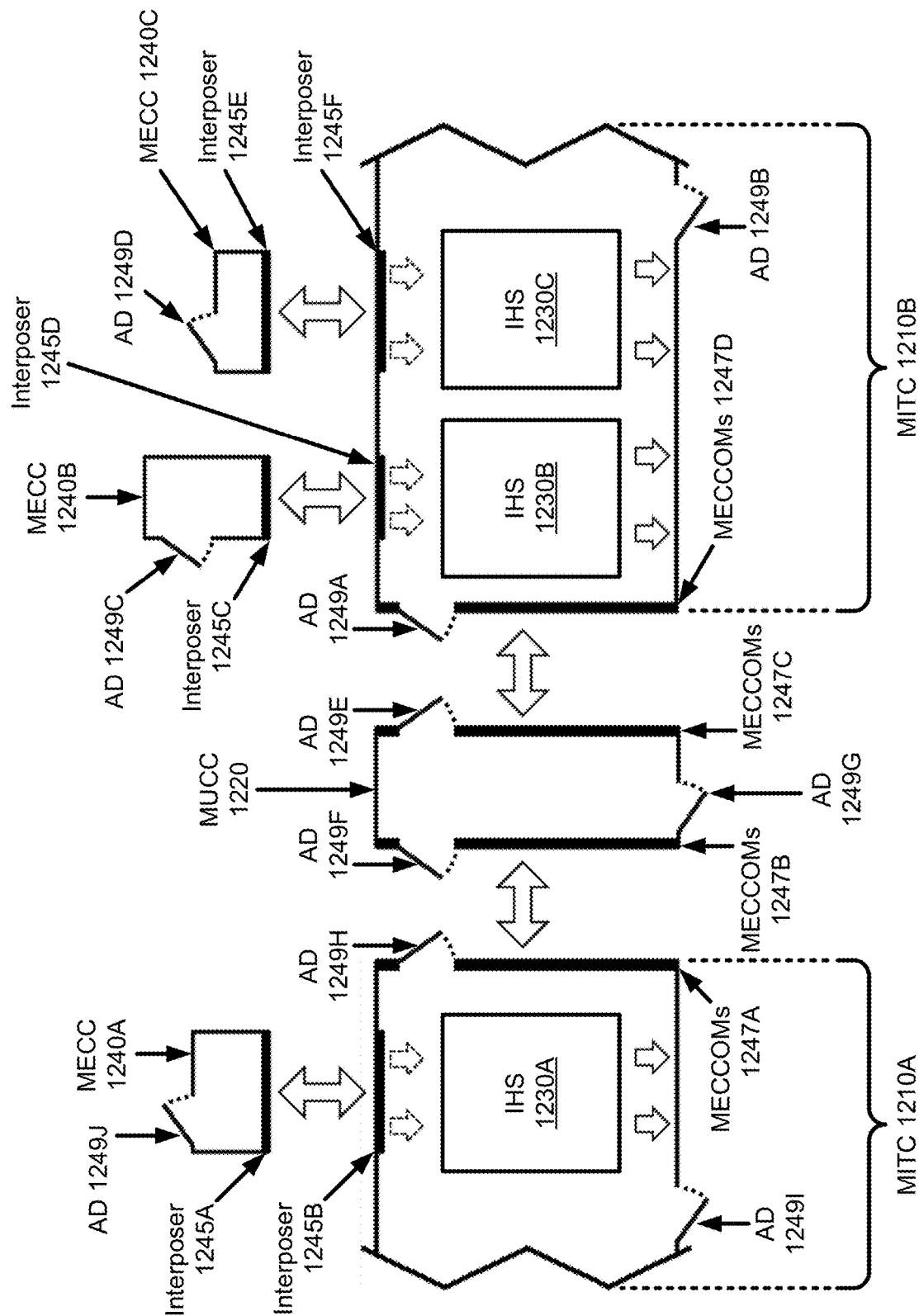
FIG. 12.1

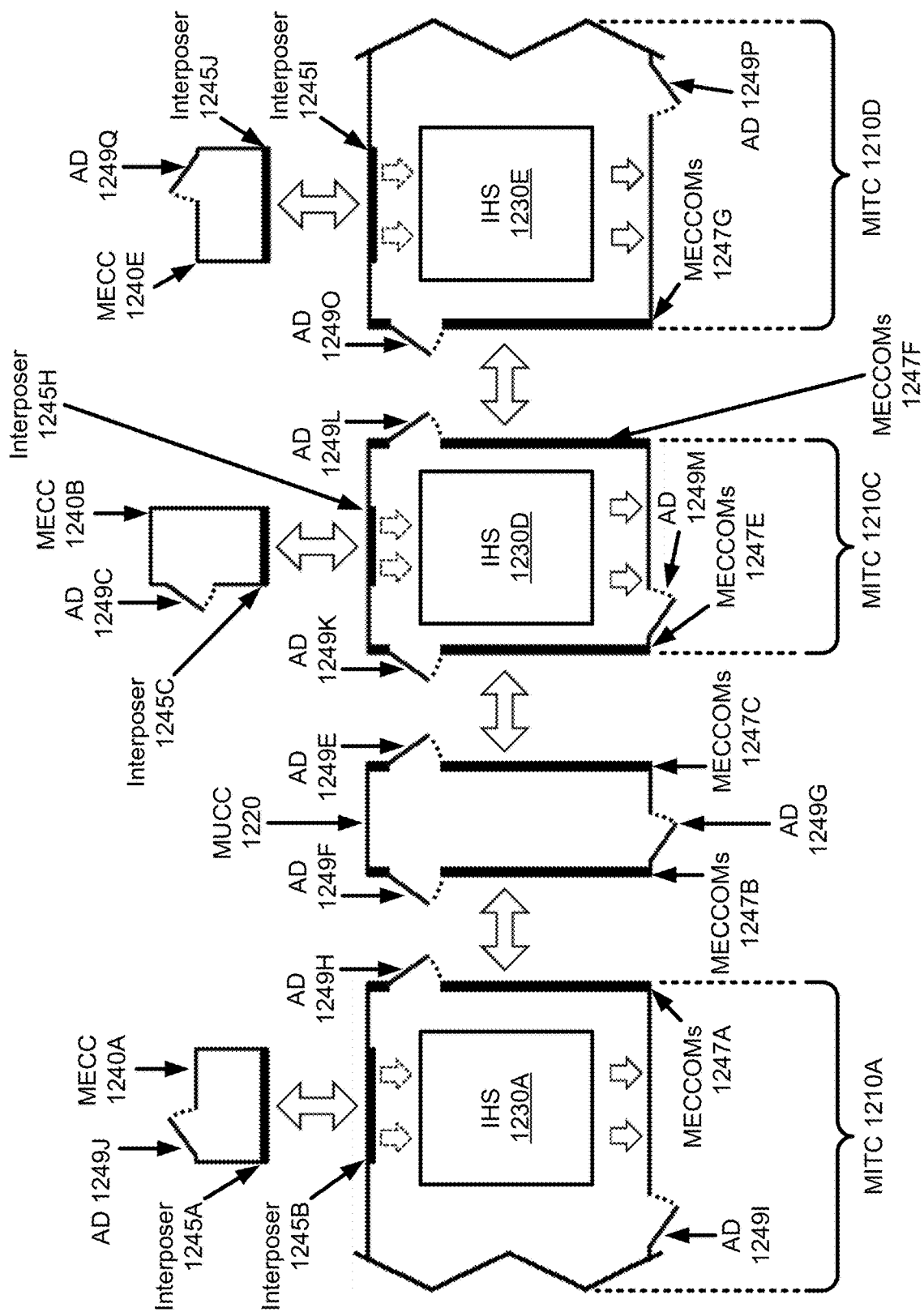
FIG. 12.2

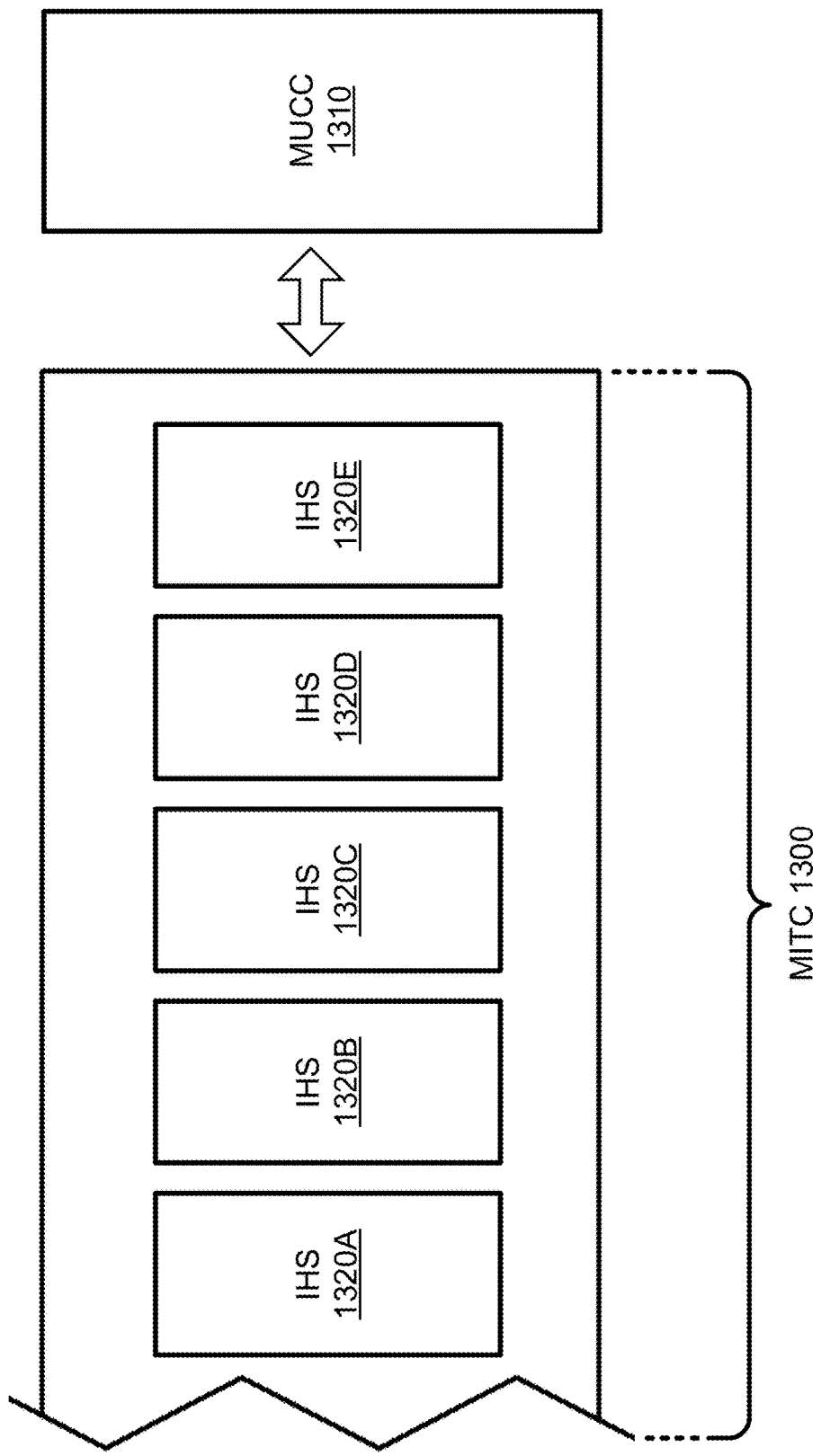
FIG. 13.1

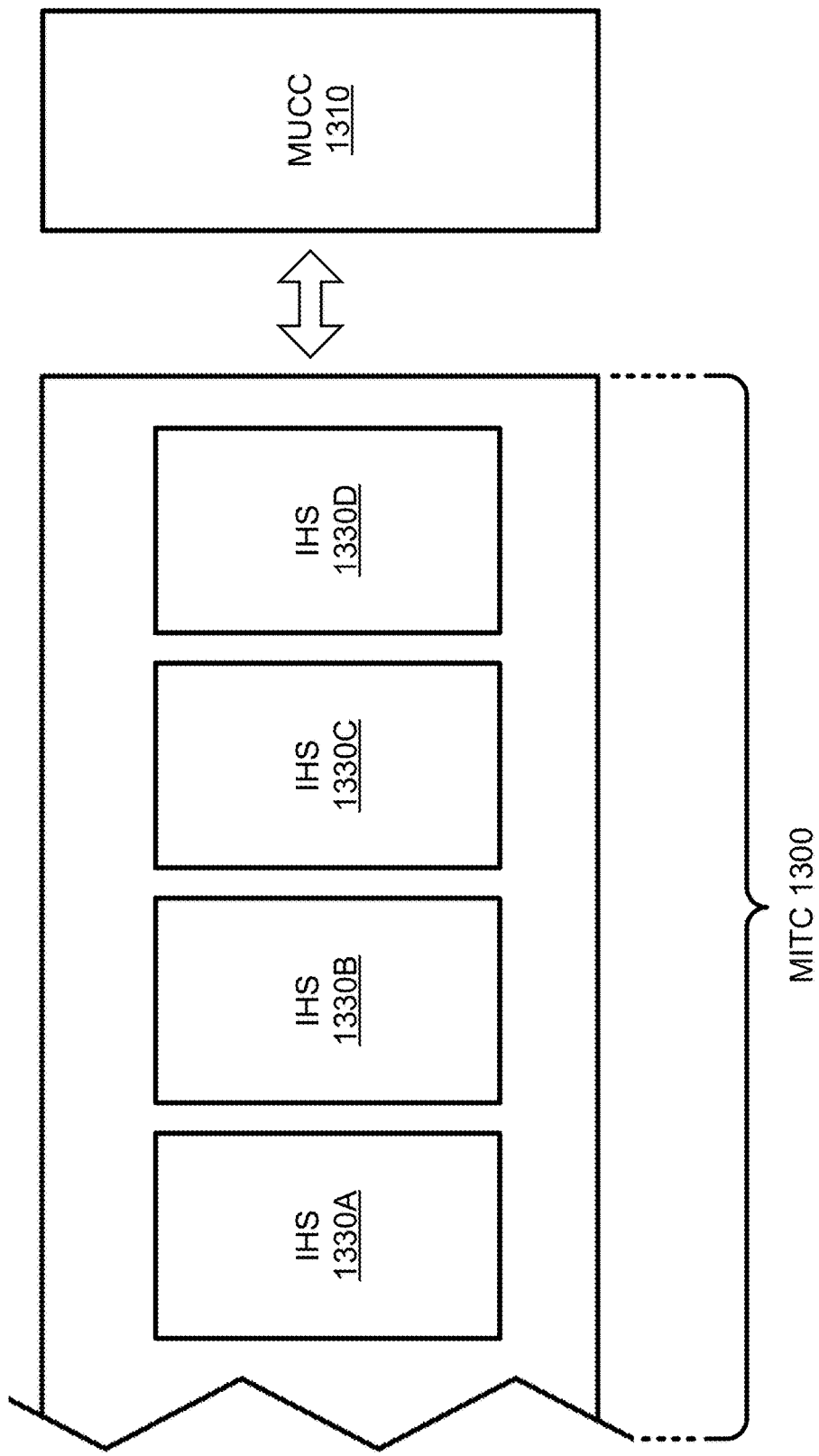
FIG. 13.2

ALL-IN-ONE, END-TO-END, AND EXPANDABLE MODULAR DATA CENTERS

BACKGROUND

The heterogeneous data center environments witnessed today often require a combination of various cooling, power, and information technology (IT) components. The cooling, power, and IT components are available either commercially with minimum configuration options (e.g., one-size-fits-all) or through a full custom solution for a specific customer demand. This either impacts scalability of the heterogeneous data center environments, or requires resource-intensive engineering for deployment of the cooling, power, and IT components.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 1.1 shows a diagram of a system in accordance with one or more embodiments of the invention.

FIG. 1.2 shows a diagram of a system in accordance with one or more embodiments of the invention.

FIG. 2.1 shows a diagram of an information handling system (IHS) in accordance with one or more embodiments of the invention.

FIG. 2.2 shows a diagram of a computing device in accordance with one or more embodiments of the invention.

FIG. 3.1 shows a top view of the system of FIG. 1.1 in accordance with one or more embodiments of the invention.

FIG. 3.2 shows a top view of the system of FIG. 1.2 in accordance with one or more embodiments of the invention.

FIG. 4.1 shows a top view of a system in accordance with one or more embodiments of the invention.

FIG. 4.2 shows a front view of a walk-in component in accordance with one or more embodiments of the invention.

FIG. 5.1 shows a top view of a system in accordance with one or more embodiments of the invention.

FIG. 5.2 shows a top view of a system in accordance with one or more embodiments of the invention.

FIG. 9.1 shows a top view of a portion of a modular information technology component (MITC) in accordance with one or more embodiments of the invention.

FIG. 9.2 shows a top view of a portion of an MITC in accordance with one or more embodiments of the invention.

FIG. 10.1 shows a side view of a portion of an MITC in accordance with one or more embodiments of the invention.

FIG. 10.2 shows a side view of a portion of an MITC in accordance with one or more embodiments of the invention.

FIG. 10.3 shows a side view of a portion of an MITC in accordance with one or more embodiments of the invention.

FIG. 12.1 shows a top view of the system of FIG. 11 in accordance with one or more embodiments of the invention.

FIG. 12.2 shows a top view of a system in accordance with one or more embodiments of the invention.

FIG. 13.1 shows a top view of a portion of an MITC and a modular utility control component (MUCC) in accordance with one or more embodiments of the invention.

FIG. 13.2 shows a top view of a portion of an MITC and a MUCC in accordance with one or more embodiments of the invention.

DETAILED DESCRIPTION

Figure 6:
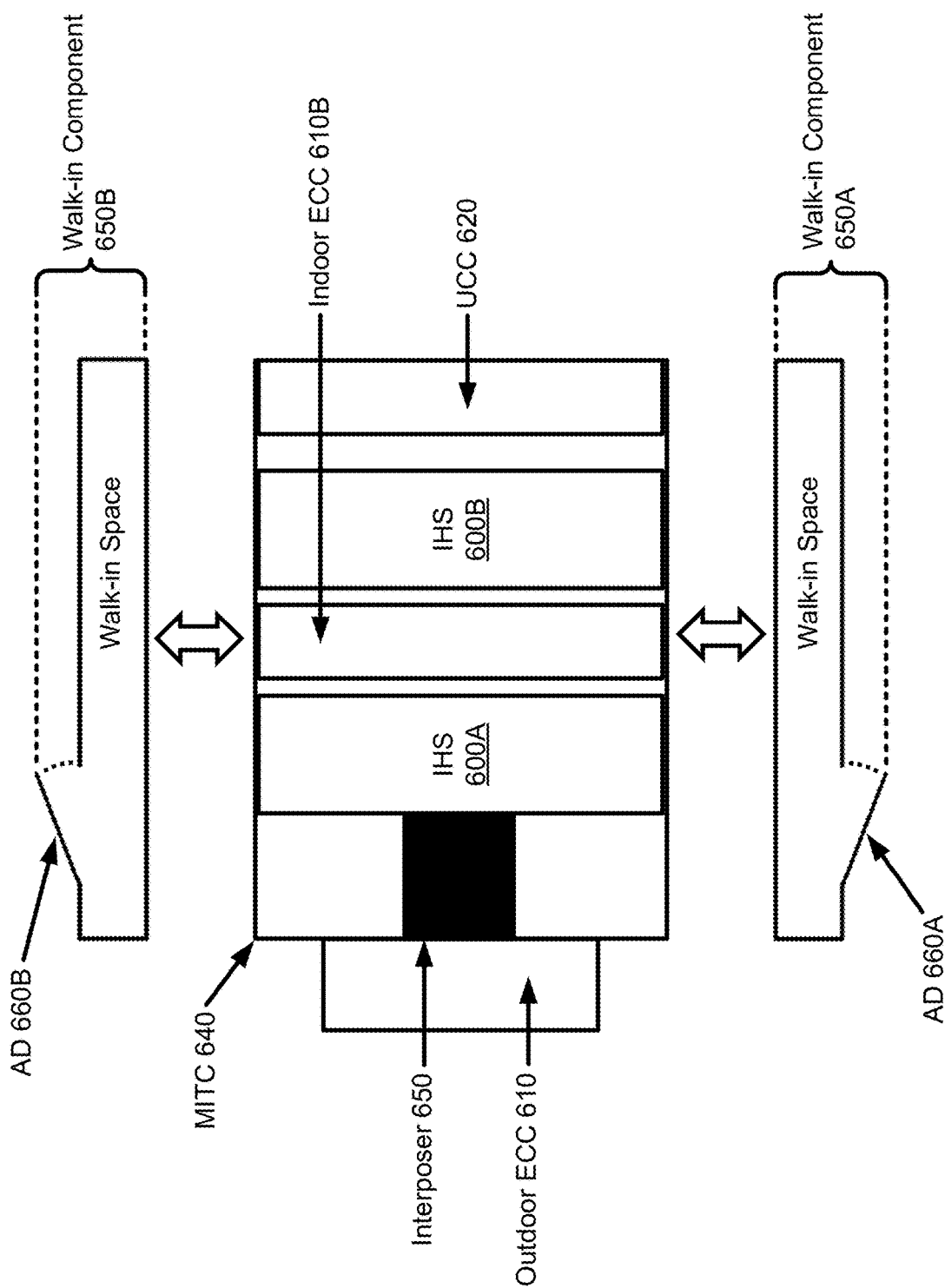
FIG. 6 shows a top view of a system in accordance with one or more embodiments of the invention.

Specific embodiments of the invention will now be described in detail with reference to the accompanying figures. In the following detailed description of the embodiments of the invention, numerous specific details are set forth in order to provide a more thorough understanding of one or more embodiments of the invention. However, it will be apparent to one of ordinary skill in the art that one or more embodiments of the invention may be practiced without these specific details. In other instances, well-known features have not been described in detail to avoid unnecessarily complicating the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items, and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure, and the number of elements of the second data structure, may be the same or different.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct connection (e.g., wired directly between two devices or components) or indirect connection (e.g., wired and/or wireless connections between any number of devices or components connecting the operatively connected devices). Thus, any path through which information may travel may be considered an operative connection.

In general, a customer using a traditional data center for high performance computing may experience issues relate to a space (e.g., a blank space within the traditional data center), capacity (e.g., a power capacity, a cooling capacity, etc.), scalability (e.g., an ability to expand the traditional data center over time), and customization (e.g., an ability to use third-party components within the traditional data center). In some cases, retrofitting the space of the traditional data center based on custom requirements (e.g., adding a water-based cooling solution, scaling up the power capacity, etc.) of the customer may be cost-ineffective and unoptimized. In some cases, a non-customized form factor of the traditional data center may not be suitable for different customers. For example, the customer may expect to have a high power capacity and a low power resiliency, while another customer may expect to have a medium cooling capacity and a high cooling resiliency.

To address one or more of the aforementioned issues, embodiments of the invention provide flexible, scalable, cost-effective, and customer-specific modular data centers to meet various custom requirements of different customers. More specifically, embodiments of the invention include different modular building blocks (e.g., a modular information technology component (MITC), a modular environmental control component (MECC), etc.) that are combined together to provide the most suitable data center for a customer. This advantageously enables to generate an all-encompassing, configurable, and less resource (e.g., engineering, manufacturing, procurement, etc.) intensive modular data center that ties the different modular building blocks together based on custom requirements of the customer.

The following describes various embodiments of the invention.

FIGS. 1.1 and 1.2 show diagrams of a system (100) including different front and rear access components in accordance with one or more embodiments of the invention. The system (100) represents a small form factor (e.g., a small shape) modular data center relative to modular data centers shown in reference to FIG. 7 and FIG. 11.

As used herein, a "modular data center" includes any facility or a portion of a facility in which computing operations are carried out. A modular data center may include IHSs and IHS components coupled together as functional IHSs, in which the IHSs and the functional IHSs are dedicated to serve specific functions or to serve multiple functions. Examples of computing operations may include (but not limited to): information processing, communications, testing, simulations, power distribution and control, operational control, etc.

Turning now to FIG. 1.1, FIG. 1.1 shows a diagram of the system (100) in accordance with one or more embodiments of the invention. The system (100) includes an MITC (155), the front access component (e.g., a walk-up component (150A)), and the rear access component (e.g., a walk-up component (150B)). The system (100) may include additional, fewer, and/or different components without departing from the scope of the invention. Each component illustrated in FIG. 1.1 is discussed below.

In an embodiment of the invention shown in FIG. 1.1, the MITC (155) may be a mechanical structure (with some depth) that enables an indoor environmental control component (ECC) (110), an information handling system (IHS) (120), and a utility control component (UCC) (140) to be positioned with respect to one another. For example, the MITC (155) may be an enclosure (e.g., a frame) that enables the indoor ECC (110), the IHS (120), and the UCC (140) to be disposed within the MITC (155).

In one or more embodiments, while disposing, the indoor ECC (110), the IHS (120), and the UCC (140) may be affixed to a bottom side (e.g., a floor) of the MITC (155) via standard mechanical mechanisms (e.g., bolts, screws, nuts, studs, etc.). Other mechanical or non-mechanical (e.g., glue, an adhesive tape, etc.) mechanisms for affixing the indoor ECC (110), the IHS (120), and the UCC (140) to the bottom side of the MITC (155) may be used without departing from the scope of the invention.

In one or more embodiments, the UCC (140) may be integrated outside of the MITC (155) to support different types of IHSs; however, the UCC-integrated MITC will still be manufactured as a monolithic system. This implies that even if the UCC (140) is integrated outside of the MITC (155), the UCC (140) is not a separate, standalone component.

In one or more embodiments, the MITC (155) may be implemented as other types of structures adapted to host, position, orient, and/or otherwise physically, mechanically, electrically, and/or thermally manage the indoor ECC (110), the IHS (120), and the UCC (140). In this manner, the MITC (155) may enable the indoor ECC (110), the IHS (120), and the UCC (140) to be densely packed without negatively impacting the operation of the indoor ECC (110), the IHS (120), and the UCC (140).

In an embodiment of the invention shown in FIG. 1.1, as a hollow frame, the MITC (155) includes four sides (i.e., a top side, a bottom side, a right side, and a left side), in which a front side and a rear side of the MITC (155) are open throats. In one or more embodiments, the walk-up component (150A) is connected to the front side of the MITC (155) and the walk-up component (150B) is connected to the rear side of the MITC (155).

In one or more embodiments, "connected" may refer to "directly connected", in which there is a seal in between, for example, (i) the walk-up component (150A) and the front side of the MITC (155), and (ii) the walk-up component (150B) and the rear side of the MITC (155). The seal and walk-up components (150A, 150B) may extend the volume of the MITC (155) towards generating a hollow cuboid.

Alternatively, "connected" may refer to "connected via one or more physical components in between". For example, the walk-up component (150A) is connected to the front side of the MITC (155), in which at least one physical component is mechanically touching the walk-up component (150A) and the front side of the MITC (155).

Similarly, the walk-up component (150B) and the rear side of the MITC (155) may be connected in a way that there are one or more physical components in between. The physical components may be mechanically touching the walk-up component (150B) and the rear side of the MITC (155).

In an embodiment of the invention shown in FIG. 1.1, the walk-up component (150A) includes five sides (i.e., a top side, a bottom side, a right side, a left side, and a front side), in which a rear side of the walk-up component (150A) is an open throat and is connected to the front side of the MITC (155). In one or more embodiments, an area of the walk-up component (150A) is equal to an area of the front side of the MITC (155).

The walk-up component (150A) may be a mechanical "reach through" structure, in which "walk-up" refers to not being able to walk inside of the MITC (155). Said another way, the walk-up component (150A) has not enough space for a customer to step inside of the walk-up component (150A).

The walk-up component (150A) includes an access door (AD) (159A). The AD (159A) includes a handle (160) that makes easier to open or close (shown with a double-headed arrow) the AD (159A) to reach through an internal environment of the MITC (155). In one or more embodiments, an area of the AD (159A) is less than or equal to the area of the front side of the MITC (155). In this manner, when the walk-up components (150A, 150B) are connected to the MITC (155) and the ADs (159A, 159B (discussed below)) are closed, a sealed volume (i.e., the system (100)) is generated.

In one or more embodiments, the area of the AD (159A) is less than the area of the front side of the MITC (155) because of a doorframe of the AD (159A). However, the AD (159A) has to be on a size of a conventional person door so that a customer (e.g., a user) may access substantially a front side of the IHS (120), a front side of the UCC (140), and a front side of the indoor ECC (110) to perform a service type of event. Said another way, a width of the AD (159A) needs to be sufficient that the customer may access substantially the front side of the IHS (120), the front side of the UCC (140), and the front side of the indoor ECC (110) without getting inside of the MITC (155).

In one or more embodiments, the service type of event may include, for example (but not limited to): changing an actuator, changing a filter, changing a sensor, etc. In one or more embodiments, because the customer not being able to walk inside of the MITC (155), the customer may perform the event while standing outside of the MITC (155).

The aforementioned examples are not intended to limit the scope of the invention.

In an embodiment of the invention shown in FIG. 1.1, the walk-up component (150B) includes five sides (i.e., a top side, a bottom side, a right side, a left side, and a front side), in which a rear side of the walk-up component (150B) is an open throat and is connected to the rear side of the MITC (155). Similar to the walk-up component (150A), an area of the walk-up component (150B) is equal to an area of the rear side of the MITC (155).

Similar to the walk-up component (150A), the walk-up component (150B) includes an AD (159B). The AD (159B) includes a handle (not shown) that makes easier to open or close (shown with a double-headed arrow) the AD (159B) to reach through the internal environment of the MITC (155). In one or more embodiments, an area of the AD (159B) is less than or equal to the area of the rear side of the MITC (155).

In one or more embodiments, the area of the AD (159B) is less than the area of the rear side of the MITC (155) because of a doorframe of the AD (159B). However, the AD (159B) has to be on the size of the conventional person door so that the customer may access substantially a rear side of the IHS (120), a rear side of the UCC (140), and a rear side of the indoor ECC (110) to perform the service type of event.

In one or more embodiments, the ADs (159A, 159B) may be wicket doors (e.g., a door in a door), in which the ADs (159A, 159B) both include a person door and a rack door. This means that the ADs (159A, 159B) are big enough to pass a rack (not shown) through the ADs (159A, 159B).

In one or more embodiments, the IHS (120) may include a rack and any number of computing devices (e.g., 130). Additional details of the IHS are described below in reference to FIGS. 2.1 and 2.2.

In one or more embodiments, the indoor ECC (110) is an in-row ECC, in which the indoor ECC (110) fits inside of a rack row (e.g., aligned with the IHS (120)) and not mounted (or not within) the IHS (120). The indoor ECC (110) may be implemented without a raised floor. In this manner, the indoor ECC (110) can be deployed to the system (100) that otherwise does not have a headroom to allow an installation of a raised floor.

As used herein, "mounting" a particular component on another component refers to positioning the particular component to be in physical contact with the other component, such that the other component provides structural support, positioning, structural load transfer, stabilization, shock absorption, some combination thereof, or the like with regard to the particular component.

The indoor ECC (110) may include one or more physical devices that alter characteristics (e.g., airflow directions, humidity of air, and temperature levels, etc.) of an internal environment of the system (100) at a macroscopic level. The physical devices may also ensure reliability of the IHS (120) and the UCC (140). In one or more embodiments, a physical device may be, for example (but not limited to): a fan, a direct expansion coil, a fluid mixture unit, a heater component, an immersion cooling component, etc.

The aforementioned example is not intended to limit the scope of the invention.

In some cases, the system (100) may be deployed to environments that result in the temperature levels of the IHS (120) and the UCC (140) being outside of their designed operating temperature levels. For example, the IHS (120) may be designed to operate at temperature levels above 0° C. When the system (100) is deployed to an environment with harsh conditions (e.g., −40° C.-60° C.), the IHS (120) may not operate properly and, in certain scenarios, may be damaged. To prevent the aforementioned issue, depending on environmental conditions, the physical devices either cool or heat the internal environment of the system (100). In this manner, stability and functionality of the IHS (120) and the UCC (140) may be preserved.

In one or more embodiments, as a gas mover, the fan may be able to change a rate of gases being taken into and expelled from the computing device (130) and the UCC (140). As a refrigerant-based cooling technology, the direct expansion (DX) coil may cool the internal environment of the system (100) using a condensed refrigerant liquid (e.g., liquid nitrogen, hydrofluorocarbons (HFCs), etc.). In this technology, the refrigerant may expand to generate a cooling effect in the DX coil that is in direct contact with a conditioned air, which will be supplied to the internal environment of the system (100).

In one or more embodiments, as a liquid cooling component, the fluid mixture unit may pump cooled fluid mixture (e.g., a mixture of water and glycerol) throughout hardware components (not shown) of the IHS (120) and of the UCC (140). An absorbed air by the fluid mixture may then be transferred to an external environment of the system (100). Similar to refrigerant-based cooling technology, the fluid mixture unit may also use a DX coil; however, instead of using a refrigerant, the fluid mixture unit uses the fluid mixture. In one or more embodiments, glycerol may behave like an antifreeze liquid, in which the fluid mixture may operate at temperatures below 0° C.

In one or more embodiments, the indoor ECC (110) may also take advantage of a cooling infrastructure that is already built-in at a customer site (e.g., a customer location, a customer facility, etc.). For example, the indoor ECC (110) may use a chilled water loop that is already available at the customer site.

As used herein, an "infrastructure" means system, components, or elements of a system that provide resources for a computing device, such as electrical power, data exchange capability with external systems, air, heat removal, and environmental control.

In one or more embodiments, the heater component may bring hardware components of the IHS (120) and of the UCC (140) into their appropriate operating temperature levels (e.g., above 0° C.) when necessary. To initiate a heating process, the heater component may obtain a required power from a modular power supply component (not shown). The heater component may be made of silicon rubber, any other material, and/or any combination thereof that enables the heater component to perform its functions. Those skilled in the art will appreciate that the heater component may be supplied with power directly or indirectly (e.g., via a heating control component, a printed circuit board, etc.) without departing from the scope of the invention.

In one or more embodiments, the heater component has a number of surfaces that is heated and when air passes through the surfaces, an induced heat may be transferred from the heater component to the volume of air drawn into the internal environment of the system (100). In one or more embodiments, a number of heat sinks (not shown) may be used to provide a uniform distribution of heated volume of air drawn into the internal environment of the system (100) through their fins, in which a bottom portion of the number of heat sinks is affixed to the heater component. In this manner, a surface area of the heater component may be expanded indirectly to increase an efficiency of the heater component.

In one or more embodiments, the indoor ECC (110) may provide "N+1" or "N+2" heating and/or cooling resiliency. In one or more embodiments, "N" resiliency may refer to having an exact number of components to operate. For example, if the system (100) needs "N" physical devices to operate and if the system (100) has "N" physical devices, this means that the system (100) has "N" resiliency. In one or more embodiments, "N+1" cooling resiliency may indicate that even if one of the physical devices is deactivated (because of a service maintenance), the system (100) may still operate. For example, the indoor ECC (110) has four fans and the indoor ECC (110) has "N+1" resiliency. In this case, the required number of fans to support operation of the system (100) is three and the indoor ECC (110) has a redundant fan. Having additional heating and/or cooling capacity (e.g., having a redundant fan, having a redundant heater component, etc.) may ensure that the system (100) has no downtime while performing a service maintenance or experiencing a failure (e.g., a hardware failure, a software failure, etc.).

In one or more embodiments, the modular power supply component may be designed by considering geographic factors of the customer site and custom requirements of the customer. The factors and the requirements may include, for example (but not limited to): a hurricane rating of a location, a required number of uninterruptible power supplies (UPSs) to support an operation, a required number of physical devices in an ECC, a required resiliency of an ECC, a required input power frequency, a required input voltage, etc.

The aforementioned example is not intended to limit the scope of the invention.

In one or more embodiments, the modular power supply component may obtain customer facility's power (which comes from a centralized power station) and then may distribute the power (i.e., provide the power) to one or more components (e.g., the indoor ECC (110), IHS (120), the UCC (140), etc.) within the system (100).

In one or more embodiments, the modular power supply component may provide DC power to the components. The modular power supply component may include functionality to convert AC power (obtained from the centralized power station) to DC power.

In one or more embodiments, the modular power supply component may provide "N" or "2 xN" power supply resiliency. For example, if the system (100) has "2 xN" power supply resiliency, this means that the modular power supply component has a functionality to provide twice the amount of power needed for the system (100). As yet another example, if the modular power supply component provides a single power supply feed, then the system (100) will have a low level of resiliency. If there is an additional power supply feed (e.g., a separate busway), then the system (100) will have a high level of resiliency. Having an additional power capacity (e.g., having a redundant UPS, having a redundant battery, etc.) may ensure that the system (100) has no downtime while performing a service maintenance or experiencing a failure.

In one or more embodiments, a power usage effectiveness (PUE) value of a component (e.g., an ECC, an IHS, etc.) at a data center indicates how energy efficient the component is. For example, as an ideal case, if a PUE value of an ECC is equal to one, this means that the ECC uses 100% of an input power that is provided to the ECC. In general, a PUE value of an ECC at a traditional data center is on average 1.57 (e.g., 64% effectiveness). Comparing to the PUE value of the ECC at the traditional data center, a PUE value of the indoor ECC (110) is on average 1.01 (e.g., 99% efficiency)- 1.043 (e.g., 95% efficiency), depending on where the system (100) is deployed. For example, if the system (100) is deployed to a hot environment (e.g., Phoenix, AZ), the PUE value of the indoor ECC (110) may be 1.043. As yet another example, if the system (100) is deployed to a mild (e.g., neither hot nor cold) environment (e.g. San Diego, CA), the PUE value of the indoor ECC (110) may be 1.01.

The aforementioned example is not intended to limit the scope of the invention.

In one or more embodiments, the UCC (140) may include one or more physical devices (e.g., panels, units, switchboards, etc.) that may provide functionality, for example (but not limited to): to detect a temperature within a system, to detect fire/smoke within a system, to suppress fire/smoke within a system, to provide an access control to a component, to manage a power distribution to a component, to manage a temperature within a system, etc.

The aforementioned example is not intended to limit the scope of the invention.

In one or more embodiments, the UCC (140) may include an ECC control panel (not shown) that is configured to manage a temperature within the system (100) and to provide heating and/or cooling control services. The heating and/or cooling control services may include, for example (but not limited to): (i) obtaining information relating to a temperature of one or more components within the system (100), where the information may be obtained through a number of temperature sensors (discussed below) within the system (100), (ii) determining whether the temperature within the system (100) is below or above an appropriate operating temperature level, (iii) initiating, based on the determination in (ii), a heating process (e.g., activating the heater component within the indoor ECC (110)) to bring the components within the system (100) into their designed operating temperature levels, (iv) initiating, based on the determination in (ii), a cooling process (e.g., activating the fluid mixture unit within the indoor ECC (110)) to bring the components within the system (100) into their designed operating temperature levels, (v) preventing damage (e.g., thermal runaway) to the heater component in the event of overheating, etc.

While described as a physical device, the ECC control panel may be implemented as a logical entity (e.g., a program executing using a number of printed circuit board components (not shown)). For example, the IHS (120) may host a program that provides the functionality of the ECC control panel.

In one or more embodiments, the ECC control panel may include one or more temperature sensors. The ECC control panel may include other types of sensors (e.g., humidity sensors, vibration sensors, corrosion sensors, differential pressure sensors, etc.) without departing from the scope of the invention. In one or more embodiments, one end of a temperature sensor may be operatively connected to at least one of the components within the system (100) to detect a temperature within the system (100). The other end of the temperature sensor may be operatively connected to the ECC control panel, in which the ECC control panel is configured to manage the components based on the temperature within the system (100).

In one or more embodiments, the UCC (140) may include a power distribution control unit (not shown) that is configured to determine which component(s) within the system (100) receive power from the modular power supply component. For example, when the heater component needs to be activated, the modular power supply component may be instructed (e.g., by the power distribution control unit) to distribute power to the heater component. As yet another example, the modular power supply component may be instructed to distribute power to the IHS (120).

The aforementioned examples are not intended to limit the scope of the invention.

In one or more embodiments, apart from the modular power supply component, the power distribution control unit may include one or more backup power resources (e.g., batteries) to support an uninterrupted service (e.g., a temperature detection service, a power distribution management service, etc.) of the UCC (140).

In one or more embodiments, the UCC (140) may also include an access control unit (not shown) that is configured to control one or more security devices that are placed at various locations on the system (100). In one or more embodiments, a security device may be, for example (but not limited to): a padlock, a badge reader, an electrified mortise lock, a biometric reader-based access contact, etc. By using, for example, a biometric reader-based access contact, the access control unit may control access provided by the ADs (159A, 159B).

The aforementioned example is not intended to limit the scope of the invention.

In one or more embodiments, the access control unit may include a blank space (with power) to plug-in third-party security devices. If a customer has an existing security system at a customer site, the customer may install (e.g., mount) the existing security system within the blank space. In this manner, the customer may have a flexibility to use built-in security devices of the UCC (140) and/or to use the existing security system for access control.

Those skilled in the art will appreciate that while the IHS (120) is shown as located in between the indoor ECC (110) and the UCC (140), the IHS (120) may be placed at any location within the MITC (155) without departing from the scope of the invention.

Turning now to FIG. 1.2, FIG. 1.2 shows a diagram of the system (100) in accordance with one or more embodiments of the invention. In one or more embodiments, the walk-up component (e.g., 150A, FIG. 1.1) is replaced with a walk-in component (170A). Similarly, the walk-up component (e.g., 150B, FIG. 1.1) is replaced with a walk-in component (170B).

In one or more embodiments, the walk-in component (170A) is connected to the front side of the MITC (155) and the walk-in component (170B) is connected to the rear side of the MITC (155). In one or more embodiments, the walk-in components (170A, 170B) (together with a seal) may extend the volume of the MITC (155) towards generating a hollow cuboid.

Alternatively, in one or more embodiments, similar to the walk-up component (e.g., 150A, FIG. 1.1), the walk-in component (170A) and the front side of the MITC (155) may be connected in a way that there are one or more physical components in between. The physical components may be mechanically touching the walk-in component (170A) and the front side of the MITC (155).

Similarly, the walk-in component (170B) and the rear side of the MITC (155) may be connected in a way that there are one or more physical components in between. The physical components may be mechanically touching the walk-in component (170B) and the rear side of the MITC (155).

In an embodiment of the invention shown in FIG. 1.2, the walk-in component (170A) includes five sides (i.e., a top side, a bottom side, a right side, a left side, and a front side), in which a rear side of the walk-in component (170A) is an open throat and is connected to the front side of the MITC (155). In one or more embodiments, an area of the walk-in component (170A) is equal to an area of the front side of the MITC (155).

The walk-in component (170A) may be a mechanical "walk through" structure, in which "walk-in" refers to being able to walk inside of the MITC (155) to perform, for example, the service type of event. In one or more embodiments, the walk-in component (170A) has a greater depth than the walk-up component (e.g., 150A, FIG. 1.1). Said another way, the walk-in component (170A) has enough space (e.g., a walk-in space) for a customer to step inside of the walk-in component.

In one or more embodiments, the walk-in component (170A) includes an AD (175A). The AD (175A) includes a handle (180) that makes easier to open or close (shown with a double-headed arrow) the AD (175A) to walk through the internal environment of the MITC (155). Details of the AD are described above in reference to FIG. 1.1.

In one or more embodiments, the AD (175A) has to be on the size of the conventional person door so that a customer may access the IHS (120), the UCC (140), and the indoor ECC (110) to perform, for example, the service type of event. Said another way, the width of the AD (175A) needs to be sufficient that the customer may access the IHS (120), the UCC (140), and the indoor ECC (110) by stepping inside of the MITC (155).

Those skilled in the art will appreciate that the customer may access the IHS (120), the UCC (140), and the indoor ECC (110) to perform any other event and/or operation without departing from the scope of the invention.

In an embodiment of the invention shown in FIG. 1.2, the walk-in component (170B) includes five sides (i.e., a top side, a bottom side, a right side, a left side, and a front side), in which a rear side of the walk-in component (170B) is an open throat and is connected to the rear side of the MITC (155). Similar to the walk-in component (170A), an area of the walk-in component (170B) is equal to an area of the rear side of the MITC (155).

Similar to the walk-in component (170A), the walk-in component (170B) includes an AD (175B). The AD (175B) includes a handle (not shown) that makes easier to open or close (shown with a double-headed arrow) the AD (175B) to walk through the internal environment of the MITC (155). The width of the AD (175B) needs to be sufficient that the customer may access the IHS (120), the UCC (140), and the indoor ECC (110) by stepping inside of the MITC (155).

In one or more embodiments, similar to the ADs (e.g., 159A, 159B, FIG. 1.1), the ADs (175A, 175B) may be wicket doors. This means that the ADs (175A, 175B) are big enough to pass a rack (not shown) through the ADs (175A, 175B).

Details of the indoor ECC and the UCC are described above in reference to FIG. 1.1.

In one or more embodiments, the systems shown in FIG. 1.1 and FIG. 1.2 are all-in-one (e.g., monolithic) modular data centers, in which the all-in-one modular data centers include the IHS (120), the indoor ECC (110), the UCC (140), and the modular power supply component all in one place. A physical and functional split between the indoor ECC (110) and the IHS (120) enables a variety of cooling technologies, capacities, and resiliencies to be paired (e.g., assembled) with a variety of power capacities, resiliencies, and IHS technologies.

In one or more embodiments, the physical and functional split may enable each component to have its own utility (i.e., power) feed, which allows for a modular independence within the system (100). For example, the indoor ECC (110) and the IHS (120) may have a separate utility feed, rather than sharing one utility feed.

Turning now to FIG. 2.1, FIG. 2.1 shows a diagram of an IHS (200) in accordance with one or more embodiments of the invention. The IHS (200) may be the same as the IHS (120) as discussed above in reference to FIG. 1.1. The IHS (200) may include a rack (220) and any number of computing devices (e.g., 210).

In one or more embodiments, the rack (220) may be a mechanical structure that enables the computing devices to be positioned with respect to one another. For example, the rack (220) may be a mountable enclosure that enables the computing devices to be disposed within the rack (220). The rack (220) may be implemented as other types of structures adapted to host, position, orient, and/or otherwise physically, mechanically, electrically, and/or thermally manage the computing devices. By managing the computing devices, the rack (220) may enable the computing devices to be densely packed in a space without negatively impacting the operation of the IHS (200).

In one or more embodiments, a computing device (e.g., 210) may be a mechanical structure for housing components of the IHS (200). For example, the computing device (e.g., 210) may be implemented as a rack-mountable enclosure for housing components of the IHS (200). The computing device (e.g., 210) may be adapted to be disposed within the rack (220) and/or utilize services provided by the rack (220) and/or other components available in the system (e.g., 100, FIG. 1.1).

In one or more embodiments, the system (e.g., 100, FIG. 1.1) may support standard racks (e.g., a 42 rack unit (RU) rack, a 750 millimeter (mm) wide rack, etc.). As a unit of measurement, the RU is equal to 1.75 inches and the RU defines an increment within a standard rack. In one or more embodiments, as a component-agnostic system (to meet custom requirements of a customer), the system (e.g., 100, FIG. 1.1) may also support custom designed racks. Both standard (e.g., off-the-shelf) racks and custom designed racks may be pre-integrated into the system (e.g., 100, FIG. 1.1) before transportation to the customer site.

In one or more embodiments, a computing device positioned into a pre-integrated rack may be ready-to-use (e.g., pre-configured with software, hardware, etc.) when deployed to the customer site. However, the customer may alter a configuration of the pre-configured computing device after the deployment. For example, the customer may increase memory capacity of the computing device after the deployment. As yet another example, the customer may increase processor capacity of the computing device after the deployment.

The aforementioned examples are not intended to limit the scope of the invention.

In one or more embodiments, one or more isolators may be attached to the components (e.g., the IHS (e.g., 120, FIG. 1.1), the indoor ECC (e.g., 110, FIG. 1.1), etc.) of the system (e.g., 100, FIG. 1.1) to make sure that the components are ready-to-use when they deployed to the customer site. In one or more embodiments, the isolators provide a shock isolation to the components such that the components may be protected from any damage (e.g., a vibrational damage).

In one or more embodiments, apart from hosting the IHS (200), the space available for the IHS (200) (within the system (e.g., 100, FIG. 1.1)) may be used to host other components, for example (but not limited to): immersion tanks, UPSs, battery racks, etc.

Turning now to FIG. 2.2, FIG. 2.2 shows a diagram of the computing device (210) in accordance with one or more embodiments of the invention. In one or more embodiments, the computing device (210) includes six sides (i.e., top, bottom, right, left, front, and rear), in which air drawn into from a front side of the computing device (e.g., via an air inlet (230)) and expelled from the rear side of the computing device (e.g., via one or more ECCs). An airflow direction is shown with a dashed line arrow (cold air) and a solid line arrow (hot air). In general, air incoming from the front side of the computing device (210) is cooler than air outgoing from the rear side of the computing device (210).

In one or more embodiments, to provide services, the computing device (210) may utilize resources provided by a number of hardware components hosted within the computing device (210). The hardware components may be, for example (but not limited to): processors, non-persistent storage devices, printed circuited boards, persistent storage devices, peripheral components interconnects, special purpose hardware components, etc. In one or more embodiments, some of the hardware components may be omitted or additional hardware components may be added based on the services provided by the computing device (210).

The aforementioned example is not intended to limit the scope of the invention.

As used herein, "computing" refers to any operations that may be performed by a computer, including (but not limited to): computation, data storage, data retrieval, communications, etc.

As used herein, a "computing device" includes any of various devices in which a computing operation may be carried out. A computing device may be, for example (but not limited to): a compute IHS component, a storage IHS component, a network device, a telecommunications component, etc.

The aforementioned examples are not intended to limit the scope of the invention.

In one or more embodiments, an all-in-one form factor of the system (e.g., 100, FIG. 1.1) may increase a PUE value of the computing device (210). For example, because the system (e.g., 100, FIG. 1.1) includes a separate cooling and/or heating unit (e.g., 110, FIG. 1.1), the computing device (210) may not have a fan and/or a heating component. In this manner, the computing device (210) may become more power dense and power-efficient.

FIGS. 3.1 and 3.2 show top views of the system (e.g., 100, FIG. 1.1) including different front and rear access components in accordance with one or more embodiments of the invention.

Turning now to FIG. 3.1, FIG. 3.1 shows a top view of the system of FIG. 1.1 in accordance with one or more embodiments of the invention. In one or more embodiments, double-headed arrows show a modularity of the system, in which the walk-up components (330A, 330B) may be attached to, or detached from the MITC (340). Details of the indoor ECC, the UCC, the walk-up components, and the IHS are described above in reference to FIG. 1.1 and FIG. 2.1, respectively.

Turning now to FIG. 3.2, FIG. 3.2 shows a top view of the system of FIG. 1.2 in accordance with one or more embodiments of the invention. In one or more embodiments, double-headed arrows show the modularity of the system, in which the walk-in components (350A, 350B) may be attached to, or detached from the MITC (340). Details of the walk-in components are described above in reference to FIG. 1.2.

Turning now to FIG. 4.1, FIG. 4.1 shows a top view of a system in accordance with one or more embodiments of the invention. In one or more embodiments, the MITC (440) includes one or more IHSs (400A, 400B). The MITC (440) also includes one or more indoor ECCs (410A, 410B).

In one or more embodiments, depending on how large the MITC (440) is, a customer may consider the walk-in components (450A, 450B) as an only option to configure the system. For example, in reference to FIG. 4.1, attaching the walk-in component (450A) to the MITC (440) enables the customer to walk into a space (e.g., a walk-in space) available within the walk-in component (450A). In this manner, the customer may perform a service type of event without standing outside of the MITC (440).

In one or more embodiments, double-headed arrows show the modularity of the system, in which the walk-in components (450A, 450B) may be attached to, or detached from the MITC (440).

Turning now to FIG. 4.2, FIG. 4.2 shows a front view of the walk-in component (450A) in accordance with one or more embodiments of the invention. In one or more embodiments, the front view includes a right wall, a left wall, the AD (460A), and the AD handle (475). The right wall is made of four components: a top scaffold (470B), a right scaffold (470A), a bottom scaffold (470E), and a right side of an AD frame (480). The left wall is made of four components: a top scaffold (470C), a left scaffold (470D), a bottom scaffold (not shown), and a left side (not shown) of the AD frame (480).

In one or more embodiments, when the AD (460A) is either closed or opened, the AD frame (480) provides structural support to the AD (460A). The AD frame (480) may also support functions of the AD (460A). The AD frame (480) may provide additional functionalities to the AD without departing from the scope of the invention.

In one or more embodiments, dashed lines show a location of the AD (460A) within the walk-in component (450A) when the AD (460A) is closed. A customer may open or close the AD (460A) via the AD handle (475). Other mechanical or non-mechanical mechanisms to open or close the AD (460A) may be used without departing from the scope of the invention.

In one or more embodiments, the AD (460A) may be connected to a number of hinges (not shown), in which the number of hinges enable an inward rotation (i.e., closing) or an outward rotation (i.e., opening) of the AD (460A). A double-headed arrow shows the inward rotation or the outward rotation of the AD (460A). Other mechanical or non-mechanical mechanisms to rotate the AD (460A) may be used without departing from the scope of the invention.

Turning now to FIG. 5.1, FIG. 5.1 shows a top view of a system in accordance with one or more embodiments of the invention. In one or more embodiments, the indoor ECC (e.g., 310, FIG. 3.1) is replaced with an outdoor ECC (510). The outdoor ECC (510) may be connected to the MITC (555) via an interposer (550). In one or more embodiments, the outdoor ECC (510) may be separated from the MITC (555) with a ducting component in between.

As used herein, a "ducting component" includes any tube, pipe, conduit, or a combination thereof, that has one or more passageways through which a fluid or a gas can be conveyed. Examples of materials for a ducting component may include a cloth, a fabric, an extruded metal, a sheet metal, a polymer, or a combination thereof. A passageway of a ducting component may have any size and shape. The cross-section of a ducting component may be square, round, ovate, rectangular, or irregular. Further, a passageway of a ducting component may have a constant or changing cross-section or a cross-section that changes over the length of the passageway.

In one or more embodiments, the interposer (550) includes electrical, mechanical, and airflow connection components. In one or more embodiments, the interposer (550) may provide functionality to connect a standard or a third-party outdoor ECC to the MITC (555).

In one or more embodiments, the electrical connection components may transmit or receive power and data (e.g., temperature data, humidity data, etc.) to or from the outdoor ECC (510). For example, the UCC (520) may collect a temperature of one or more components within the MITC (555) as temperature data. Based on the collected data, the UCC (520) may activate or deactivate the outdoor ECC (510) using the electrical connection components.

In one or more embodiments, the mechanical connection components keep the outdoor ECC (510) connected to the MITC (555). The mechanical connection components also provide structural support to the outdoor ECC (510) and to the MITC (555) in case of a seismic event. The mechanical connection components may be, for example (but not limited to): steel plates with bolted connections, mechanical hard-stop components, sealing components, etc.

In one or more embodiments, the airflow connection components may be ducting components that allow using either standard or custom designed outdoor ECCs. The airflow connection components may change (e.g., twist) a direction of an airflow formed between the outdoor ECC (510) and the MITC (555). For example, the interposer (550) may include a bottom ducting component and an overhead ducting component. The bottom ducting component may supply cold air into the MITC (555). The overhead ducting component may remove hot air from the MITC (555) and may deliver the hot air to the outdoor ECC (510).

In one or more embodiments, the outdoor ECC (510) may include the same functionalities as the indoor ECC (e.g., 310, FIG. 3.1). For example, the outdoor ECC (510) may include one or more physical devices that alter characteristics of an internal environment of the system at a macroscopic level. As yet another example, the outdoor ECC (510) may provide "N+1" or "N+2" heating and/or cooling resiliency. Details of the functionalities are described above in reference to FIG. 1.1.

The aforementioned examples are not intended to limit the scope of the invention.

In one or more embodiments, similar to FIG. 3.1, double-headed arrows show a modularity of the system, in which the walk-up components (530A, 530B) may be attached to, or detached from the MITC (555). Details of the UCC, the walk-up components, and the IHS are described above in reference to FIG. 1.1 and FIG. 2.1, respectively.

Turning now to FIG. 5.2 FIG. 5.2 shows a top view of a system in accordance with one or more embodiments of the invention. In one or more embodiments, the walk-up components (e.g., 530A, 530B, FIG. 5.1) are replaced with walk-in components (560A, 560B). Similar to FIG. 5.1, the double-headed arrows show the modularity of the system, in which the walk-in components (560A, 560B) may be attached to, or detached from the MITC (555). Details of the walk-in components are described above in reference to FIG. 1.1.

Turning now to FIG. 6, FIG. 6 shows a top view of a system in accordance with one or more embodiments of the invention. In one or more embodiments, in comparison to FIG. 4.1, one of the indoor ECCs (e.g., 410A, FIG. 4.1) is replaced with an outdoor ECC (610) and an interposer (650). Similar to FIG. 5.2, the double-headed arrows show the modularity of the system, in which the walk-in components (660A, 660B) may be attached to, or detached from the MITC (640). Details of the UCC, the walk-in components, the IHSs, the outdoor ECC, and the interposer are described above in reference to FIG. 1.1, FIG. 2.1, and FIG. 5.1, respectively.

In one or more embodiments, the all-in-one and small form factor of the modular data center (the system (e.g., 100, FIG. 1.1)) described in FIGS. 1.1-6 makes the system (e.g., 100, FIG. 1.1) deployable to, for example (but not limited to): space-limited locations, remote locations, etc. The space-limited locations may be, for example (but not limited to): lab spaces, localized data ingest and compute locations, etc. The remote locations (e.g., edge locations) may be locations that are away from specialized IT and security personnel to maintain an operation of the modular data center.

Providing multiple functionalities and fitting these functionalities into the small form factor make formation, deployment, and operation of the all-in-one modular data center easier for a customer. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Figure 7:
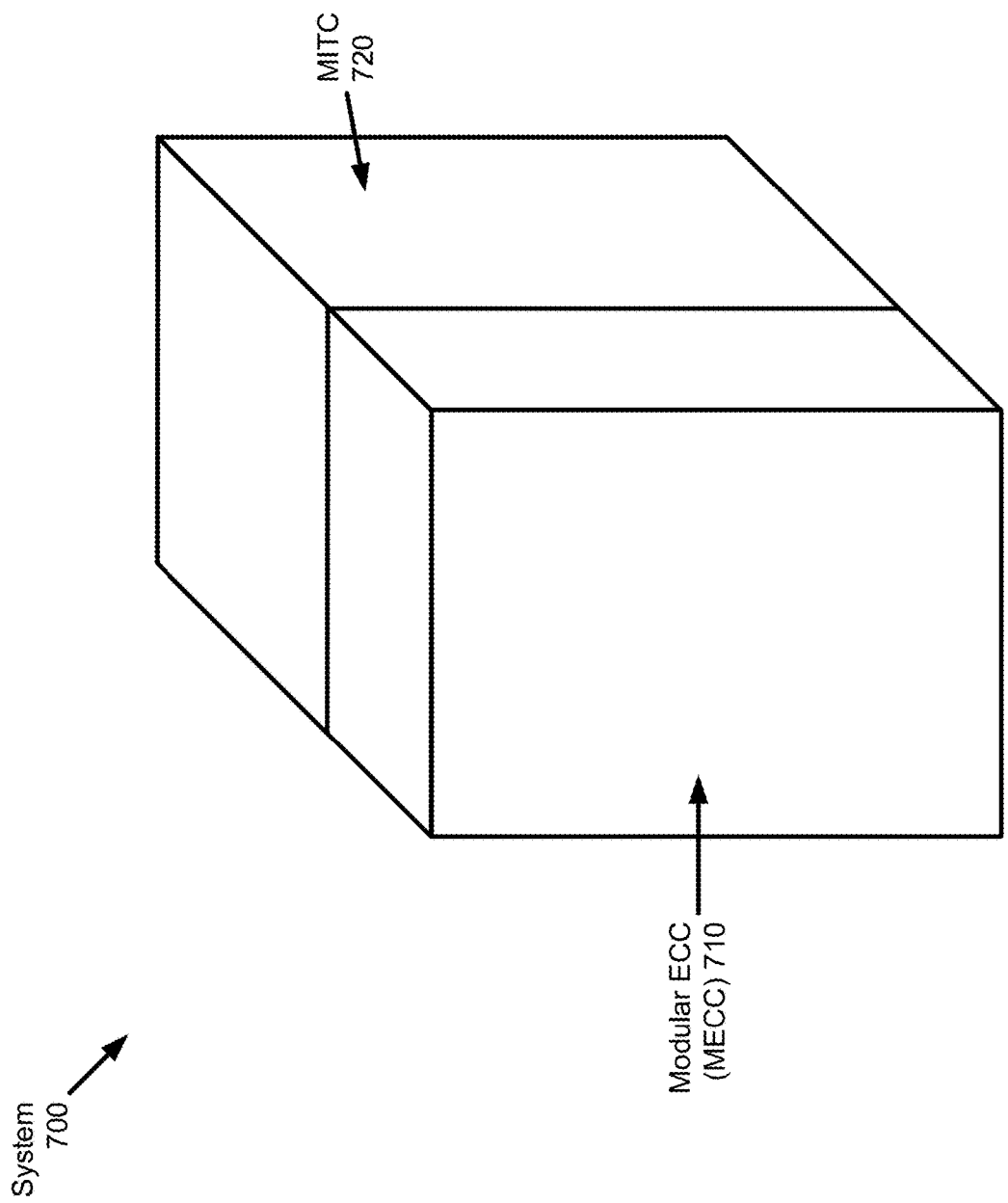
FIG. 7 shows a diagram of a system in accordance with one or more embodiments of the invention.

Turning now to FIG. 7, FIG. 7 shows a diagram of a system (700) in accordance with one or more embodiments of the invention. The system (700) includes an MITC (720) and a modular ECC (MECC) (710). The system (700) may include additional, fewer, and/or different components (e.g., modular building blocks) without departing from the scope of the invention. Each component illustrated in FIG. 7 is described below in reference to FIG. 8.

In comparison to the system shown in FIG. 1.1, the system (700) represents a medium form factor modular data center that provides the same functionalities with higher computing power and higher power density.

Figure 8:
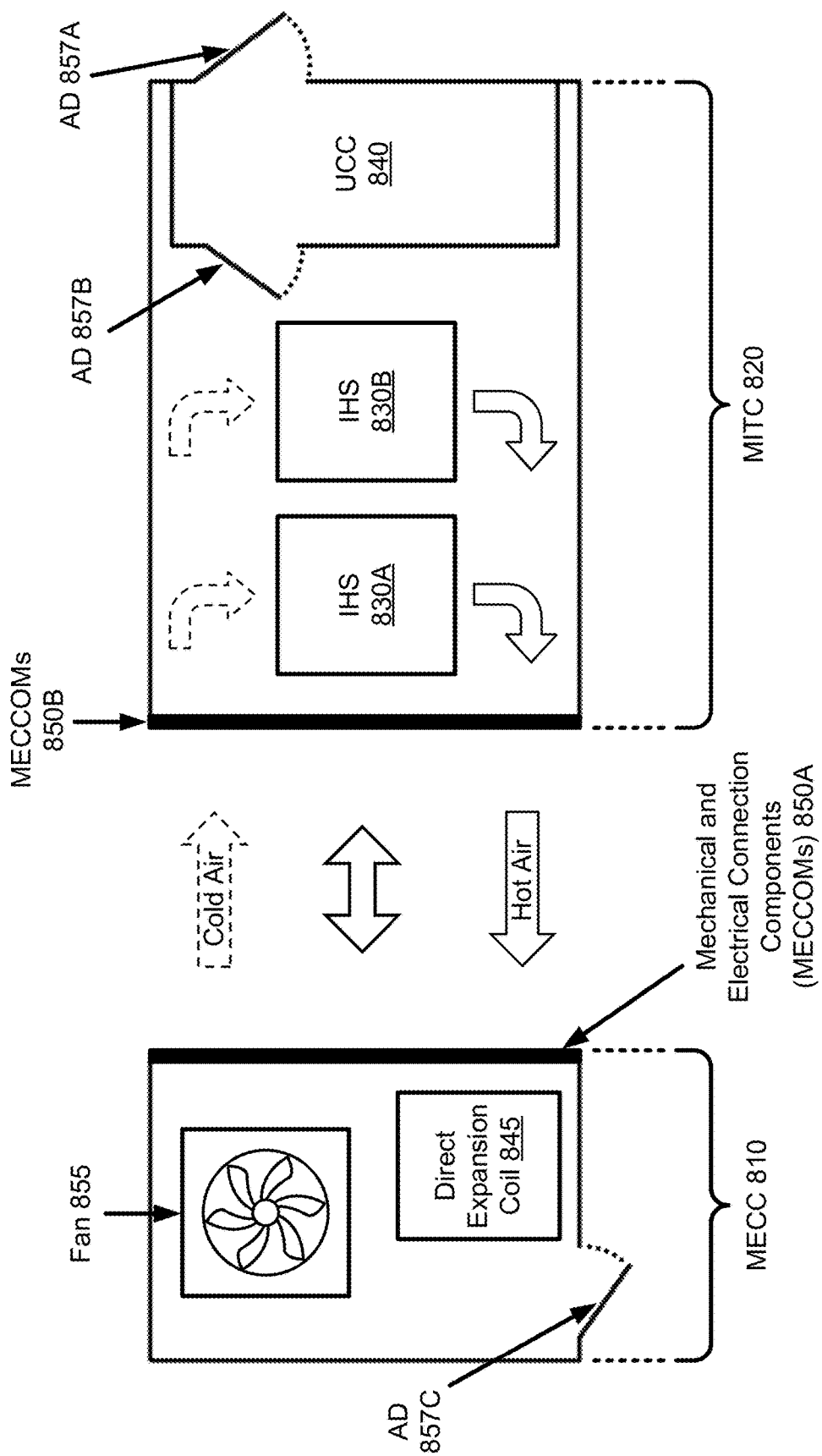
FIG. 8 shows a top view of the system of FIG. 7 in accordance with one or more embodiments of the invention.

Turning now to FIG. 8, FIG. 8 shows a top view of the system of FIG. 7 in accordance with one or more embodiments of the invention. In an embodiment of the invention shown in FIG. 8, the MITC (820) may be a mechanical structure that enables one or more IHSs (830A, 830B) and a UCC (840) to be disposed within the MITC (820).

In one or more embodiments, while disposing, the IHSs (830A, 830B) may be affixed to a floor (not shown) within the MITC (820) via the standard mechanical mechanisms. In one or more embodiments, the floor is affixed to a bottom side of the MITC (820). Other mechanical or non-mechanical mechanisms for affixing the IHSs (830A, 830B) to the floor may be used without departing from the scope of the invention. Details of the IHSs are described above in reference to FIG. 2.1.

In one or more embodiments, a white space within the MITC (820), where the IHSs (830A, 830B) are located, may have a functionality to host different types of standard racks (e.g., 4×750 mm wide racks, 5×600 mm wide racks, etc.). The white space may also have a functionality to host custom designed racks. Both standard and custom designed racks may be pre-integrated into the floor before transportation to the customer site. Additional details of the different types of racks are described below in reference to FIGS. 9.1-10.3.

In one or more embodiments, apart from hosting the IHSs (830A, 830B), the white space may also host other components, for example (but not limited to): immersion tanks, UPSs, battery racks, cable management towers, cooling distribution units (CDUs), etc.

The aforementioned example is not intended to limit the scope of the invention.

In one or more embodiments, the MITC (820) may be implemented as other types of structures adapted to host, position, orient, and/or otherwise physically, mechanically, electrically, and/or thermally manage the IHSs (830A, 830B) and the UCC (840). In this manner, the MITC (820) may enable the IHSs (830A, 830B) and the UCC (840) to be densely packed without negatively impacting the operation of the IHSs (830A, 830B) and the UCC (840).

In one or more embodiments, the UCC (840) is integrated within the MITC (820) to support different types of IHSs, in which the UCC-integrated MITC is manufactured as a monolithic system. This implies that the UCC (840) is not a separate, standalone component. Details of the UCC are described above in reference to FIG. 1.1.

Those skilled in the art will appreciate that while the IHSs (830A, 830B) and the UCC (840) are shown as located on a particular side of the MITC (820), the IHSs (830A, 830B) and the UCC (840) may be located on any other side of the MITC (820) without departing from the scope of the invention.

In one or more embodiments, the MITC (820) includes an AD (857A). Similarly, the UCC (840) includes an AD (857B). In one or more embodiments, the ADs (857A, 857B)

may be walk-in doors or walk-up doors. For example, as a walk-in door, the AD (857A) may permit user access to the UCC (840). As yet another example, as a walk-in door, the AD (857B) may permit user access to an internal environment of the MITC (820). Details of the ADs are described above in reference to FIG. 1.1.

The aforementioned examples are not intended to limit the scope of the invention.

Those skilled in the art will appreciate that while the ADs (857A, 857B) are shown as located on a rear side of the MITC (820) and a front side of the UCC (840), respectively, the ADs (857A, 857B) may be located on any other side of the MITC (820) and the UCC (840) without departing from the scope of the invention.

In one or more embodiments, the MITC (820) includes a connection interface, in which the connection interface is affixed to a pairing end of the MITC (820). The pairing end of the MITC (820) refers to a portion of the MITC (820) that can be paired with another component (e.g., a MECC (810)). In one or more embodiments, the connection interface of the MITC (820) includes mechanical and electrical connection components (MECCOMs) (850B). The connection interface of the MITC (820) also includes built-in airflow connection components. Details of the MECCOMs are described above in reference to FIG. 5.1.

In one or more embodiments, an area (e.g., height×width) enclosed by the connection interface of the MITC (820) is equal to an area enclosed by a connection interface of the MECC (810) (discussed below). In this manner, an end-to-end pairing between the MITC (820) and the MECC (810) may be installed (e.g., established) for compatible mechanical, electrical, and airflow connections.

The MECC (810) may include one or more physical devices (e.g., ECCs) that alter characteristics of an internal environment of the MITC (820) at a macroscopic level. The physical devices may also ensure reliability of the IHSs (830A, 830B) and the UCC (840). In one or more embodiments, the physical devices may be affixed to a floor of the MECC (810). In one or more embodiments, a physical device may be, for example (but not limited to): a fan (855), a DX coil (845), a fluid mixture unit, a heater component, an immersion cooling component, etc. Details of the physical devices are described above in reference to FIG. 1.1.

In one or more embodiments, the MECC (810) supplies cold air (shown with a dashed line arrow) to the internal environment of the MITC (820) (including the UCC (840)) via the built-in airflow connection components. The MECC (810) also removes hot air (shown with a solid line arrow) from the internal environment of the MITC (820) (including the UCC (840)) via the built-in airflow connection components. In one or more embodiments, the dashed line and the solid line arrows inside of the MITC (820) may be referred to as a "cold aisle" and a "hot aisle", respectively.

The cold aisle may refer to an area (e.g., a space) in which conditioned (e.g., cold) air is introduced to a front side of the IHSs (830A, 830B) and to the UCC (840) to remove heat. The cold air may also be introduced to other components located within the internal environment of the MITC (820) without departing from the scope of the invention.

The hot aisle may refer to an area in which conditioned (e.g., hot) air is removed from a rear side of the IHSs (830A, 830B) and from the UCC (840) for the reliability of the IHSs (830A, 830B) and the UCC (840). The hot air may also be removed from other components located within the internal environment of the MITC (820) without departing from the scope of the invention.

In one or more embodiments, similar to the MITC (820), the MECC (810) includes an AD (857C). In one or more embodiments, the AD (857C) may be a walk-in door or a walk-up door. For example, as a walk-in door, the AD (857C) may permit user access to the MECC (810).

The aforementioned example is not intended to limit the scope of the invention.

Those skilled in the art will appreciate that while the AD (857C) is shown as located on a right side of the MECC (810), the AD (857C) may be located on any other side of the MECC (810) without departing from the scope of the invention.

In one or more embodiments, as being separate components and as having separate ADs, once paired, the MITC (820) and the MECC (810) provide an additional security measure to the user access. For example, user 1 has access to the AD (857C) and user 2 has access to the ADs (857A-857C). In this case, because user 2 has access to all ADs, user 2 can access to the UCC (840), the MITC (820), and the MECC (810). However, because user 1 has access only to the AD (857C), user 1 cannot access to the UCC (840) and to the MITC (820).

The aforementioned example is not intended to limit the scope of the invention.

In one or more embodiments, similar to the MITC (820), the MECC (810) includes a connection interface, in which the connection interface is affixed to a pairing end of the MECC (810). The pairing end of the MECC (810) refers to a portion of the MECC (810) that can be paired with another component (e.g., the MITC (820)). In one or more embodiments, similar to the MITC (820), the connection interface of the MECC (810) includes MECCOMs (850A). The connection interface of the MECC (810) also includes the built-in airflow connection components.

In one or more embodiments, the MITC (820) and the MECC (810) are oriented in a same direction. Further, a double-headed arrow shows modularity of the system (e.g., 700, FIG. 7), in which the MECC (810) may be attached to, or detached from the MITC (820) along the same direction.

Those skilled in the art will appreciate that while the IHSs (830A, 830B) are oriented in parallel to the MECCOMs (850B), the IHSs (830A, 830B) may be oriented in any direction without departing from the scope of the invention.

FIGS. 9.1 and 9.2 show top views of a portion of the MITC (e.g., 820, FIG. 8) in accordance with one or more embodiments of the invention.

Turning now to FIG. 9.1, FIG. 9.1 shows a top view of a portion of an MITC (900) in accordance with one or more embodiments of the invention. In one or more embodiments, the white space within the MITC (900) may have a functionality to host different types of racks. For example, for a 3150-mm wide white space, the MITC (900) may host 4×750 mm wide racks (shown below in reference to FIG. 9.2) or 5×600 mm wide racks (e.g., racks of IHSs (920A-920E)). A 150-mm difference in between a total width of the racks and a total width of the white space is to tolerate any rack size mismatch scenarios. As yet another example, for a 6300-mm wide white space, the MITC (900) may host 8×750 mm wide racks or 10×600 mm wide racks. In this manner, a customer may have an option to dispose different size and number of racks within the MITC (900).

In one or more embodiments, the UCC (910) may be the same as the UCC (840) as discussed above in reference to FIG. 8. In one or more embodiments, the UCC (910) may be a standard UCC. However, depending on a customer requirement (e.g., more computing power, more network capacity, etc.), a size of the UCC (910) may be expanded because, for example, more computing power needs a larger modular power supply component within the UCC (910). Details of the modular power supply component are described above in reference to FIG. 1.1.

The aforementioned examples are not intended to limit the scope of the invention.

Turning now to FIG. 9.2, FIG. 9.2 shows the top view of the portion of the MITC (900) in accordance with one or more embodiments of the invention. In one or more embodiments, for example, for the 3150-mm wide white space, the MITC (900) may host 4×750 mm wide racks (e.g., racks of IHSs (930A-930D)). As yet another example, for a 12600-mm wide white space, the MITC (900) may host 16×750 mm wide racks or 20×600 mm wide racks. In this manner, the customer may have the option to dispose different size and number of racks within the MITC (900).

The aforementioned examples are not intended to limit the scope of the invention.

FIGS. 10.1-10.3 show side views of a portion of the MITC (e.g., 820, FIG. 8) including different racks in accordance with one or more embodiments of the invention.

Turning now to FIG. 10.1, FIG. 10.1 shows a side view of a portion of the MITC (e.g., 820, FIG. 8) in accordance with one or more embodiments of the invention. In one or more embodiments, similar to FIG. 9.1, the white space within the MITC (1000) may have the functionality to host different types of racks. For example, for a 3150-mm wide white space, the MITC (1000) may host 4×54 RU racks (e.g., racks of IHSs (1020A-1020C)) or 5×52 RU racks (shown below in reference to FIG. 10.3). As yet another example, for a 6300-mm wide white space, the MITC (1000) may host 8×54 RU racks or 10×52 RU racks. In this manner, the customer may have the option to dispose different size and number of racks within the MITC (1000).

In one or more embodiments, similar to FIG. 9.1, the UCC (1010) may be the standard UCC or the expanded UCC.

The aforementioned examples are not intended to limit the scope of the invention.

Turning now to FIG. 10.2, FIG. 10.2 shows a side view of a portion of the MITC (e.g., 820, FIG. 8) in accordance with one or more embodiments of the invention. In one or more embodiments, similar to FIG. 10.1, the white space within the MITC (1000) may have the functionality to host different types of racks. For example, for a 9450-mm wide white space, the MITC (1000) may host 12×48 RU racks (e.g., racks of IHSs (1030A-1030C)) or 15×54 RU racks. As yet another example, for a 12600-mm wide white space, the MITC (1000) may host 16×48 RU racks or 20×54 RU racks. In this manner, the customer may have the option to dispose different size and number of racks within the MITC (1000).

In one or more embodiments, similar to FIG. 9.1, the UCC (1010) may be the standard UCC or the expanded UCC.

The aforementioned examples are not intended to limit the scope of the invention.

Turning now to FIG. 10.3, FIG. 10.3 shows a side view of a portion of the MITC (e.g., 820, FIG. 8) in accordance with one or more embodiments of the invention. In one or more embodiments, similar to FIG. 10.1, the white space within the MITC (1000) may have the functionality to host different types of racks. For example, for a 9450-mm wide white space, the MITC (1000) may host 2×48 RU racks, 2×52 RU racks (e.g., a rack of IHS (1040A)), and 2×54 RU racks. As yet another example, for a 12600-mm wide white space, the MITC (1000) may host 4×48 RU racks, 4×52 RU racks, and 4×54 RU racks. In this manner, the customer may have the option to dispose different size and number of racks within the MITC (1000).

In one or more embodiments, similar to FIG. 9.1, the UCC (1010) may be the standard UCC or the expanded UCC.

The aforementioned examples are not intended to limit the scope of the invention.

In one or more embodiments, the end-to-end and medium form factor of the modular data center (the system (e.g., 700, FIG. 7)) described in FIGS. 7-10.3 makes the system (e.g., 700, FIG. 7) deployable to, for example (but not limited to): space-unlimited locations, remote locations, etc. The space-unlimited locations may be, for example (but not limited to): university campuses, research and development locations, etc.

Providing multiple functionalities and fitting these functionalities into the medium form factor make formation, deployment, and operation of the end-to-end modular data center easier for a customer that needs higher computing power. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Further, a physical and functional split between the MECC (e.g., 810, FIG. 8) and the MITC (e.g., 820, FIG. 8) enables a variety of cooling technologies, capacities, and resiliencies to be paired with a variety of power capacities, resiliencies, and IHS technologies.

Figure 11:
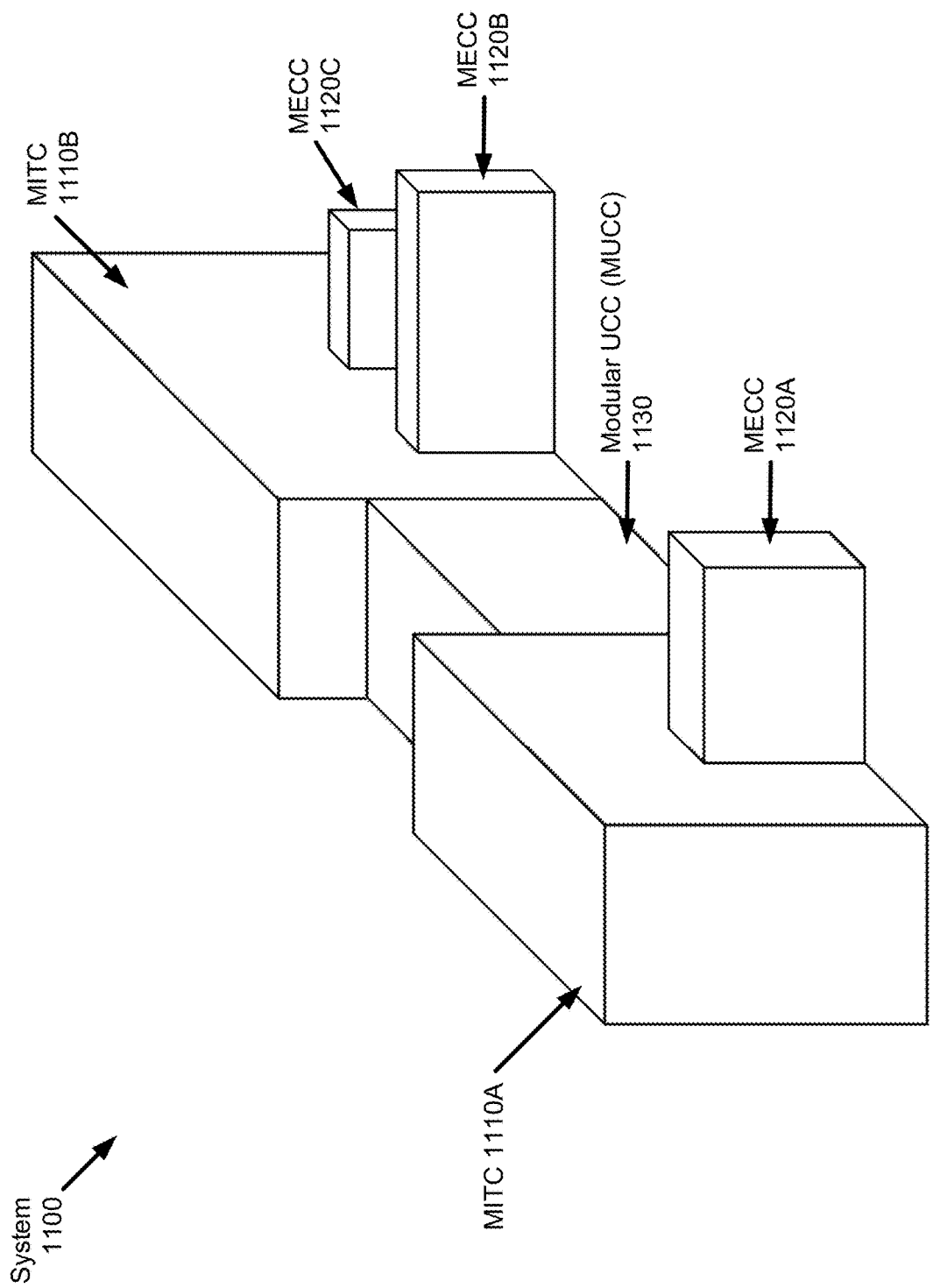
FIG. 11 shows a diagram of a system in accordance with one or more embodiments of the invention.

Turning now to FIG. 11, FIG. 11 shows a diagram of a system (1100) in accordance with one or more embodiments of the invention. The system (1100) includes one or more MITCs (1110A, 1110B), one or more MECCs (1120A-1120C), and a modular UCC (MUCC) (1130). The system (1100) may include additional, fewer, and/or different modular building blocks without departing from the scope of the invention. Each component illustrated in FIG. 11 is described below in reference to FIG. 12.1.

In comparison to the system shown in FIG. 7, the system (1100) represents a large form factor modular data center that provides additional functionalities (e.g., scalability over time) with higher computing power and higher power density.

Turning now to FIG. 12.1, FIG. 12.1 shows a top view of the system of FIG. 11 in accordance with one or more embodiments of the invention. In an embodiment of the invention shown in FIG. 12.1, the MITC (1210A) may be a mechanical structure that enables an IHS (1230A) to be disposed within the MITC (1210A). Similarly, the MITC (1210B) may be a mechanical structure that enables one or more IHSs (1230B, 1230C) to be disposed within the MITC (1210B).

In one or more embodiments, while disposing, the IHSs (1230A-1230C) may be affixed to floors (not shown) within the MITCs (1210A, 1210B) via the standard mechanical mechanisms. In one or more embodiments, the floors are affixed to bottom sides of the MITCs (1210A, 1210B). Other mechanical or non-mechanical mechanisms for affixing the IHSs (1230A-1230C) to the floors may be used without departing from the scope of the invention.

In one or more embodiments, white spaces within the MITCs (1210A, 1210B), where the IHSs (1230A-1230C) are located, may have a functionality to host different types of standard racks (e.g., 4×750 mm wide racks, 5×600 mm wide racks, etc.). The white spaces may also have a functionality to host custom designed racks. Both standard and custom designed racks may be pre-integrated into the floors before transportation to the customer site. Additional details of the different types of racks are described below in reference to FIGS. 13.1 and 13.2.

In one or more embodiments, apart from hosting the IHSs (1230A-1230C), the white spaces may also host other components, for example (but not limited to): immersion tanks, UPSs, battery racks, cable management towers, etc.

In one or more embodiments, the MITCs (1210A, 1210B) may be implemented as other types of structures adapted to host, position, orient, and/or otherwise physically, mechanically, electrically, and/or thermally manage the IHSs (1230A-1230C). In this manner, the MITCs (1210A, 1210B) may enable the IHSs (1230A-1230C) to be densely packed without negatively impacting the operation of the IHSs (1230A-1230C).

In one or more embodiments, as opposed to being integrated an inside of the MITC (1210A) or an inside of the MITC (1210B), the MUCC (1220) is manufactured as a separate component. In this manner, the MUCC (1220) may support one or more components at the same time. For example, the MUCC (1220) may include a shared power supply component (not shown), in which the shared power supply component may have a functionality (e.g., a higher power capacity, a dynamic power distribution capability, etc.) to support the MITCs (1210A, 1210B) and MECCs (1240A-1240C) at the same time.

In one or more embodiments, MUCC (1220) may be a standard MUCC. However, depending on how many components need to be supported, or, depending on a customer requirement, a size of the MUCC (1220) may be expanded. For example, supporting four MITCs (rather than supporting two MITCs) needs a larger shared power supply component. For this reason, the size of the MUCC (1220) needs to be expanded to host the larger shared power supply component.

The aforementioned examples are not intended to limit the scope of the invention.

In one or more embodiments, in addition to the MUCC (1220), the system (e.g., 1100, FIG. 11) may provide one-to-one power architecture, in which each of the MITCs (1210A, 1210B) and/or the MECCs (1240A-1240C) may have a separate power supply component (e.g., a UPS, a battery, a transformer, etc.). For example, the MITC (1210A) may need a larger current rating and a higher battery runtime to perform a complex task (e.g., a data migration from a distributed computing system). In this case, the power supply component of the MITC (1210A) may provide an additional power to the MITC (1210A).

The aforementioned example is not intended to limit the scope of the invention.

In one or more embodiments, (i) the MITC (1210A) includes ADs (1249I, 1249H), (ii) the MITC (1210B) includes ADs (1249A, 1249B), and (iii) the MUCC (1220) includes ADs (1249E-1249G). In one or more embodiments, the ADs (1249A, 1249B, and 1249E-1249I) may be walk-in doors or walk-up doors. For example, as a walk-in door, the AD (1249I) may permit user access to an internal environment of the MITC (1210A). As yet another example, as a walk-in door, the AD (1249G) may permit user access to an internal environment of the MUCC (1220).

The aforementioned examples are not intended to limit the scope of the invention.

Those skilled in the art will appreciate that while the ADs (1249A, 1249B, and 1249E-1249I) are shown as located on a particular side of the MITCs (1210A, 1210B) and the MUCC (1220), the ADs (1249A, 1249B, and 1249E-1249I) may be located on any other side of the MITCs (1210A, 1210B) and the MUCC (1220) without departing from the scope of the invention.

In one or more embodiments, the MITC (1210A) includes a connection interface, in which the connection interface is affixed to a first pairing end of the MITC (1210A). The first pairing end of the MITC (1210A) refers to a portion of the MITC (1210A) that can be paired in parallel with another component (e.g., the MUCC (1220)). In one or more embodiments, the connection interface of the MITC (1210A) includes MECCOMs (1247A). The connection interface of the MITC (1210A) also includes the built-in airflow connection components.

Further, the MITC (1210A) includes an interposer (1245B), in which the interposer (1245B) is affixed to a second pairing end of the MITC (1210A). The second pairing end of the MITC (1210A) refers to a portion of the MITC (1210A) that can be paired perpendicularly with another component (e.g., the MECC (1240A)).

In one or more embodiments, similar to the MITC (1210A), the MITC (1210B) includes a connection interface, in which the connection interface is affixed to a first pairing end of the MITC (1210B). In one or more embodiments, the connection interface of the MITC (1210B) includes MECCOMs (1247D). The connection interface of the MITC (1210B) also includes the built-in airflow connection components.

Further, similar to the MITC (1210A), the MITC (1210B) includes interposers (1245D, 1245F), in which the interposers (1245D, 1245F) are affixed to second and third pairing ends of the MITC (1210B), respectively.

In one or more embodiments, the MUCC (1220) includes one or more connection interfaces, in which each of the connection interfaces is affixed to one of the pairing ends of the MUCC (1220). In one or more embodiments, a first connection interface of the MUCC (1220) includes MECCOMs (1247B). Similarly, a second connection interface of the MUCC (1220) includes MECCOMs (1247C). Both connection interfaces of the MUCC (1220) also include the built-in airflow connection components.

In one or more embodiments, an area enclosed by the connection interface of the MITC (1210A) is equal to an area enclosed by the first connection interface of the MUCC (1220). In this manner, an end-to-end pairing between the MITC (1210A) and the MUCC (1220) may be installed for compatible mechanical, electrical, and airflow connections. Similarly, an area enclosed by the connection interface of the MITC (1210B) is equal to an area enclosed by the second connection interface of the MUCC (1220). In this manner, an end-to-end pairing between the MITC (1210B) and the MUCC (1220) may be installed for compatible mechanical, electrical, and airflow connections.

The MECC (1240A) may include one or more physical devices that alter characteristics of an internal environment of the MITC (1210A) and the MUCC (1220) at a macroscopic level. The physical devices may also ensure reliability of the IHS (1230A) and the MUCC (1220). In one or more embodiments, the physical devices may be affixed to a floor of the MECC (1240A).

In one or more embodiments, the MECC (1240A) supplies cold air (shown with dashed line arrows) to the internal environment of the MITC (1210A) (including the MUCC (1220)) via the interposers (1245A, 1245B). The MECC (1240A) also removes hot air (shown with solid line arrows) from the internal environment of the MITC (1210A) (including the MUCC (1220)) via the interposers (1245A, 1245B). In one or more embodiments, the dashed line and the solid line arrows inside of the MITC (1210A) may be referred to as a cold aisle and a hot aisle, respectively. Details of the cold aisle and the hot aisle are described above in reference to FIG. 8.

In one or more embodiments, the interposer (1245A) is affixed to a pairing end of the MECC (1240A). In one or more embodiments, the MECC (1240A) includes an AD (1249J), in which the AD (1249J) may be a walk-in door or a walk-up door. For example, as a walk-in door, the AD (1249J) may permit user access to an internal environment of the MECC (1240A).

The aforementioned example is not intended to limit the scope of the invention.

Those skilled in the art will appreciate that while the AD (1249J) is shown as located on a rear side of the MECC (1240A), the AD (1249J) may be located on any other side of the MECC (1240A) without departing from the scope of the invention.

In one or more embodiments, the interposer (1245B) includes components that allow to connect to either standard or custom designed MECCs. In one or more embodiments, the interposers (1245A, 1245B) include airflow connection components that may twist a direction of an airflow formed between the MECC (1240A) and the MITC (1210A). For example, the interposers (1245A, 1245B) may include a bottom ducting component and an overhead ducting component. The bottom ducting component may supply cold air into the MITC (1210A). The overhead ducting component may remove hot air from the MITC (1210A) and may deliver the hot air to the MECC (1240A).

In one or more embodiments, an area of the interposer (1245A) is equal to an area of the interposer (1245B). In this manner, an end-to-end pairing between the MITC (1210A) and the MECC (1240A) may be installed for compatible mechanical, electrical, and airflow connections.

In one or more embodiments, the MECC (1240B) includes an interposer (1245C), in which the interposer (1245C) is affixed to a pairing end of the MECC (1240B). Similarly, the MECC (1240C) includes an interposer (1245E), in which the interposer (1245E) is affixed to a pairing end of the MECC (1240C).

In one or more embodiments, the MECC (1240B) also includes an AD (1249C) and the MECC (1240C) also includes an AD (1249D). In one or more embodiments, the ADs (1249C, 1249D) may be walk-in doors or walk-up doors. For example, as a walk-in door, the AD (1249C) may permit user access to an internal environment of the MECC (1240B).

The aforementioned example is not intended to limit the scope of the invention.

Those skilled in the art will appreciate that while the AD (1249C) is shown as located on a right side of the MECC (1240B) and the AD (1249D) is shown as located on a rear side of the MECC (1240C), the ADs (1249C, 1249D) may be located on any other side of the MECCs (1240B, 1240C) without departing from the scope of the invention.

In one or more embodiments, an area of the interposer (1245C) is equal to an area of the interposer (1245D). Similarly, an area of the interposer (1245E) is equal to an area of the interposer (1245F). In this manner, an end-to-end pairing between the MITC (1210B) and the MECCs (1240B, 1240C) may be installed for compatible mechanical, electrical, and airflow connections.

In one or more embodiments, similar to the MECC (1240A), the MECCs (1240B, 1240C) may include one or more physical devices that alter characteristics of the internal environment of the MITC (1210B) and the MUCC (1220) at a macroscopic level. The physical devices may also ensure reliability of the IHSs (1230B, 1230C) and the MUCC (1220). In one or more embodiments, the physical devices may be affixed to floors of the MECCs (1240B, 1240C).

In one or more embodiments, similar to the MECC (1240A), the MECCs (1240B, 1240C) supply cold air (shown with dashed line arrows) to the internal environment of the MITC (1210B) (including the MUCC (1220)) via the interposers (1245C-1245F). The MECCs (1240B, 1240C) also remove hot air (shown with solid line arrows) from the internal environment of the MITC (1210B) (including the MUCC (1220)) via the interposers (1245C-1245F). In one or more embodiments, the dashed line and the solid line arrows inside of the MITC (1210B) may be referred to as a cold aisle and a hot aisle, respectively.

In one or more embodiments, the interposers (1245D, 1245F) include components that allow to connect to either standard or custom designed MECCs. In one or more embodiments, the interposers (1245C-1245F) include airflow connection components that may twist a direction of an airflow formed between the MECCs (1240B, 1240C) and the MITC (1210B). For example, the interposers (1245C-1245F) may include a bottom ducting component and an overhead ducting component. The bottom ducting component may supply cold air into the MITC (1210B). The overhead ducting component may remove hot air from the MITC (1210B) and may deliver the hot air to the MECCs (1240B, 1240C).

In one or more embodiments, depending on structural (e.g., a size), locational (e.g., being located in a harsh environment), and performance (e.g., an ability to perform complex tasks) characteristics of the MITCs (1210A, 1210B), the MITCs (1210A, 1210B) may be connected to additional MECCs.

In one or more embodiments, the MITCs (1210A, 1210B) and the MUCC (1220) are oriented in a first direction, and the MECCs (1240A-1240C) are oriented in a second direction, in which the first direction and the second direction are perpendicular to each other. The MITCs (1210A, 1210B), the MUCC (1220), and the MECCs (1240A-1240C) may be oriented differently with respect to each other without departing from the scope of the invention.

In one or more embodiments, perpendicularly oriented double-headed arrows show the modularity of the system (e.g., 1100, FIG. 11), in which the MECCs (1240A-1240C) may be attached to, or detached from the MITCs (1210A, 1210B). Similarly, remaining double-headed arrows also show the modularity of the system (e.g., 1100, FIG. 11), in which the MUCC (1220) may be attached to, or detached from the MITCs (1210A, 1210B).

In one or more embodiments, rather than being perpendicularly oriented with the MITC (1210A), the MECC (1240A) may be placed (e.g., stacked) on top of the MITC (1210A). Similarly, rather than being perpendicularly oriented with the MITC (1210B), the MECCs (1240B, 1240C) may be stacked on top of the MITC (1210B). In this manner, the modularity of the system (e.g., 1100, FIG. 11) can be further improved.

Further, a physical and functional split between the MECCs (1240A-1240C), the MITCs (1210A, 1210B), and the MUCC (1220) enables a variety of cooling technologies, capacities, and resiliencies to be paired with a variety of power capacities, resiliencies, MUCC technologies, and IHS technologies.

Those skilled in the art will appreciate that while the IHSs (1230A-1230C) are shown as located on a particular side of the MITCs (1210A, 1210B), the IHSs (1230A-1230C) may be located on any other side of the MITCs (1210A, 1210B) without departing from the scope of the invention.

Those skilled in the art will appreciate that while the IHSs (1230A-1230C) are oriented in parallel to the MECCOMs (1247A, 1247D), the IHSs (1230A-1230C) may be oriented in any direction without departing from the scope of the invention.

Turning now to FIG. 12.2, FIG. 12.2 shows a top view of a system in accordance with one or more embodiments of the invention. In one or more embodiments, the MITC (e.g., 1210B, FIG. 12.1) is replaced with two MITCs (1210C, 1210D) and the MECC (e.g., 1240C, FIG. 12.1) is replaced with a MECC (1240E).

In an embodiment of the invention shown in FIG. 12.2, the MITC (1210C) may be a mechanical structure that enables an IHS (1230D) to be disposed within the MITC (1210C). Similarly, the MITC (1210D) may be a mechanical structure that enables an IHS (1230E) to be disposed within the MITC (1210D).

In one or more embodiments, while disposing, the IHSs (1230D, 1230E) may be affixed to floors (not shown) within the MITCs (1210C, 1210D) via the standard mechanical mechanisms. In one or more embodiments, the floors are affixed to bottom sides of the MITCs (1210C, 1210D). Other mechanical or non-mechanical mechanisms for affixing the IHSs (1230D, 1230E) to the floors may be used without departing from the scope of the invention.

In one or more embodiments, white spaces within the MITCs (1210C, 1210D), where the IHSs (1230D, 1230E) are located, may have a functionality to host different types of standard racks (e.g., a 42 RU rack, a 750 mm wide rack, etc.). The white spaces may also have a functionality to host custom designed racks. Both standard and custom designed racks may be pre-integrated into the floors before transportation to the customer site.

In one or more embodiments, apart from hosting the IHSs (1230D, 1230E), the white spaces may host other components, for example (but not limited to): immersion tanks, UPSs, battery racks, cable management towers, etc.

In one or more embodiments, the MITCs (1210C, 1210D) may be implemented as other types of structures adapted to host, position, orient, and/or otherwise physically, mechanically, electrically, and/or thermally manage the IHSs (1230D, 1230E). In this manner, the MITCs (1210C, 1210D) may enable the IHSs (1230D, 1230E) to be densely packed without negatively impacting the operation of the IHSs (1230D, 1230E).

In one or more embodiments, the MITC (1210C) includes ADs (1249K-1249M) and the MITC (1210D) includes ADs (1249O, 1249P). In one or more embodiments, the ADs (1249K-1249M, 1249O, and 1249P) may be walk-in doors or walk-up doors. For example, as a walk-in door, the AD 1249M may permit user access to an internal environment of the MITC (1210C). As yet another example, as a walk-in door, the AD 1249P may permit user access to an internal environment of the MITC (1210D).

The aforementioned examples are not intended to limit the scope of the invention.

Those skilled in the art will appreciate that while the ADs (1249K-1249M, 1249O, and 1249P) are shown as located on a particular side of the MITCs (1210C, 1210D), the ADs (1249K-1249M, 1249O, and 1249P) may be located on any other side of the MITCs (1210C, 1210D) without departing from the scope of the invention.

In one or more embodiments, the MITC (1210C) includes two connection interfaces, in which a first connection interface is affixed to a first pairing end of the MITC (1210C) and a second connection interface is affixed to a second pairing end of the MITC (1210C). The first pairing end of the MITC (1210C) refers to a portion of the MITC (1210C) that can be paired in parallel with another component (e.g., MUCC (1220)). The second pairing end of the MITC (1210C) refers to a second portion of the MITC (1210C) that can also be paired in parallel with another component (e.g., MITC (1210D)).

In one or more embodiments, the connection interfaces of the MITC (1210C) include MECCOMs (1247E, 1247F). The connection interfaces of the MITC (1210C) also include the built-in airflow connection components.

In one or more embodiments, the MITC (1210C) also includes an interposer (1245H), in which the interposer (1245H) is affixed to a third pairing end of the MITC (1210C). The third pairing end of the MITC (1210C) refers to a portion of the MITC (1210C) that can be paired perpendicularly with another component (e.g., MECC (1240B)).

In one or more embodiments, similar to the MITC (1210C), the MITC (1210D) includes a connection interface, in which the connection interface is affixed to a first pairing end of the MITC (1210D). In one or more embodiments, the connection interface of the MITC (1210D) includes MECCOMs (1247G). The connection interface of the MITC (1210D) also includes the built-in airflow connection components.

In one or more embodiments, similar to the MITC (1210C), the MITC (1210D) also includes an interposer (1245I), in which the interposer (1245I) is affixed to a second pairing end of the MITC (1210D). The second pairing end of the MITC (1210D) refers to a portion of the MITC (1210D) that can be paired perpendicularly with another component (e.g., MECC (1240E)).

In one or more embodiments, an area enclosed by the first connection interface of the MITC (1210C) is equal to an area enclosed by the second connection interface of the MUCC (1220). In this manner, an end-to-end pairing between the MITC (1210C) and the MUCC (1220) may be installed for compatible mechanical, electrical, and airflow connections. Similarly, an area enclosed by the second connection interface of the MITC (1210C) is equal to an area enclosed by the connection interface of the MITC (1210D). In this manner, an end-to-end pairing between the MITC (1210C) and the MITC (1210D) may be installed for compatible mechanical, electrical, and airflow connections.

The MECC (1240E) may include one or more physical devices that alter characteristics of an internal environment of the MITC (1210D) at a macroscopic level. The physical devices may also ensure reliability of the IHS (1230E). In one or more embodiments, the physical devices may be affixed to a floor of the MECC (1240E).

In one or more embodiments, the MECC (1240E) supplies cold air (shown with dashed line arrows) to the internal environment of the MITC (1210D) via the interposers (1245J, 1245I). The MECC (1240E) also removes hot air (shown with solid line arrows) from the internal environment of the MITC (1210D) via the interposers (1245J, 1245I). In one or more embodiments, the dashed line and the solid line arrows inside of the MITC (1210D) may be referred to as a cold aisle and a hot aisle, respectively.

In one or more embodiments, the interposer (1245J) is affixed to a pairing end of the MECC (1240E). Further, the MECC (1240E) includes an AD (1249Q), in which the AD (1249Q) may be a walk-in door or a walk-up door. For example, as a walk-in door, the AD 1249Q may permit user access to an internal environment of the MECC (1240E).

The aforementioned example is not intended to limit the scope of the invention.

Those skilled in the art will appreciate that while the AD (1249Q) is shown as located on a rear side of the MECC (1240E), the AD (1249Q) may be located on any other side of the MECC (1240E) without departing from the scope of the invention.

In one or more embodiments, the interposer (1245I) includes components that allow to connect to either standard or custom designed MECCs. In one or more embodiments, the interposers (1245J, 1245I) may include airflow connection components that may twist a direction of an airflow formed between the MECC (1240E) and the MITC (1210D). For example, the interposers (1245J, 1245I) may include a bottom ducting component and an overhead ducting component. The bottom ducting component may supply cold air into the MITC (1210D). The overhead ducting component may remove hot air from the MITC (1210D) and may deliver the hot air to the MECC (1240E).

In one or more embodiments, an area of the interposer (1245J) is equal to an area of the interposer (1245I). In this manner, an end-to-end pairing between the MITC (1210D) and the MECC (1240E) may be installed for compatible mechanical, electrical, and airflow connections.

In one or more embodiments, depending on structural, locational, and performance parameters of the MITCs (1210C, 1210D), the MITCs (1210C, 1210D) may be connected to additional MECCs.

In one or more embodiments, the MITCs (1210A, 1210C, and 1210D) and the MUCC (1220) are oriented in the first direction, and the MECCs (1240A, 1240B, and 1240E) are oriented in the second direction. The MITCs (1210A, 1210C, and 1210D), the MUCC (1220), and the MECCs (1240A, 1240B, and 1240E) may be oriented differently with respect to each other without departing from the scope of the invention.

In one or more embodiments, perpendicularly oriented double-headed arrows show the modularity of the system, in which the MECCs (1240A, 1240B, and 1240E) may be attached to, or detached from the MITCs (1210A, 1210C, and 1210D). Similarly, remaining double-headed arrows also show the modularity of the system, in which the MUCC (1220) may be attached to, or detached from the MITCs (1210A, 1210C), and the MITC (1210D) may be attached to, or detached from the MITC (1210C).

In one or more embodiments, rather than being perpendicularly oriented with the MITC (1210C), the MECC (1240B) may be stacked on top of the MITC (1210C). Similarly, rather than being perpendicularly oriented with the MITC (1210D), the MECC (1240E) may be stacked on top of the MITC (1210D). In this manner, the modularity of the system can be further improved.

Further, a physical and functional split between the MECCs (1240A, 1240B, and 1240E), the MITCs (1210A, 1210C, and 1210D), and the MUCC (1220) enables a variety of cooling technologies, capacities, and resiliencies to be paired with a variety of power capacities, resiliencies, MUCC, and IHS technologies.

Those skilled in the art will appreciate that while the IHSs (1230A, 1230C, and 1230E) are shown as located on a particular side of the MITCs (1210A, 1210C, and 1210D), the IHSs (1230A, 1230C, and 1230E) may be located on any other side of the MITCs (1210A, 1210C, 1210D) without departing from the scope of the invention.

Those skilled in the art will appreciate that while the IHSs (1230A, 1230C, and 1230E) are oriented in parallel to the MECCOMs (1247A, 1247E-1247G), the IHSs (1230A, 1230C, and 1230E) may be oriented in any direction without departing from the scope of the invention.

FIGS. 13.1 and 13.2 show top views of a portion of the MITC (e.g., 1210A, FIG. 12.1) and the MUCC (e.g., 1220, FIG. 12.1) in accordance with one or more embodiments of the invention.

Turning now to FIG. 13.1, FIG. 13.1 shows a top view of a portion of an MITC (1300) and a MUCC (1310) in accordance with one or more embodiments of the invention. In one or more embodiments, the white space within the MITC (1300) may have a functionality to host different types of racks. For example, for a 3150-mm wide white space, the MITC (1300) may host 4×750 mm wide racks (shown below in reference to FIG. 13.2) or 5×600 mm wide racks (e.g., racks of IHSs (1320A-1320E)). A 150-mm difference in between a total width of the racks and a total width of the white space is to tolerate any rack size mismatch scenarios. As yet another example, for a 6300-mm wide white space, the MITC (1300) may host 8×750 mm wide racks or 10×600 mm wide racks. In this manner, a customer may have an option to dispose different size and number of racks within the MITC (1300).

The aforementioned examples are not intended to limit the scope of the invention.

In one or more embodiments, the MUCC (1310) may have same functionalities as that of the standard UCC or the expanded UCC (not shown).

Turning now to FIG. 13.2, FIG. 13.2 shows the top view of the portion of the MITC (1300) and the MUCC (1310) in accordance with one or more embodiments of the invention. In one or more embodiments, for example, for the 3150-mm wide white space, the MITC (1300) may host 4×750 mm wide racks (e.g., racks of IHSs (1330A-1330D)). As yet another example, for a 12600-mm wide white space, the MITC (1300) may host 16×750 mm wide racks or 20×600 mm wide racks. In this manner, the customer may have the option to dispose different size and number of racks within the MITC (1300).

The aforementioned examples are not intended to limit the scope of the invention.

In one or more embodiments, the end-to-end and large form factor of the modular data center (the system (e.g., 1100, FIG. 11)) described in FIGS. 11-13.2 makes the system (e.g., 1100, FIG. 11) suitable for larger workloads (e.g., parallel processing in a distributed computing system) and deployable to, for example (but not limited to): space-unlimited locations, remote locations, etc.

Providing multiple functionalities and fitting these functionalities into the large form factor make formation, deployment, and operation of the end-to-end modular data center easier for a customer that needs higher computing power, higher power density, and scalability. These functionalities also make possible to move from centralized cloud computing to decentralized edge computing and to add or remove components from the large form factor modular data center over time. These functionalities may include, for example (but not limited to): a pre-integrated and ready-to-use IHS, an ability to plug into an existing security system, multiple ECC options, a high ECC resiliency, an optimized power distribution, higher power density within a data center, an easy service access, flexibility to support third-party components, customer-specific component design, scalability over time, etc.

The problems discussed throughout this application should be understood as being examples of problems solved by embodiments described herein, and the various embodiments should not be limited to solving the same/similar problems. The disclosed embodiments are broadly applicable to address a range of problems beyond those discussed herein.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A modular data center, comprising:
    a modular information technology component (MITC), wherein the MITC comprises an information handling system (IHS), an indoor environmental control component (ECC), and a utility control component (UCC), wherein the IHS and the UCC are affixed to a bottom side of the MITC,
        wherein the MITC is manufactured as a monolithic system and the UCC is not a standalone component,
        wherein the indoor ECC is an in-row ECC and is implemented without a raised floor inside the MITC,
        wherein the indoor ECC manages an airflow direction within an internal environment of the modular data center and provides heating and cooling resiliency to support operation of the IHS,
        wherein the UCC manages a temperature within the IHS and detects and suppresses a fire within the IHS; and
    a front access component and a rear access component,
        wherein the front access component is connected to a front side of the MITC,
        wherein an area of the front access component is equal to an area of the front side of the MITC,
        wherein the rear access component is connected to a rear side of the MITC, and
        wherein an area of the rear access component is equal to an area of the rear side of the MITC.

2. The modular data center of claim 1, wherein the IHS comprises a rack and a plurality of computing devices, wherein the rack is a housing for the plurality of computing devices.

3. The modular data center of claim 1,
    wherein the front access component is a first walk-up component or a first walk-in component, and wherein the rear access component is a second walk-up component or a second walk-in component.

4. The modular data center of claim 3,
    wherein the first walk-up component comprises an access door, wherein the access door comprises a handle,
    wherein an area of the access door is less than or equal to the area of the front side of the MITC or to the area of the rear side of the MITC,
    wherein a user accesses a front side of the IHS and a front side of the UCC using the first walk-up component, and
    wherein a user accesses a rear side of the IHS and a rear side of the UCC using the second walk-up component.

5. The modular data center of claim 3,
    wherein the first walk-in component has a greater depth than the first walk-up component,
    wherein the first walk-in component comprises a walk-in space and an access door, wherein the access door comprises a handle,
    wherein an area of the access door is less than or equal to the area of the front side of the MITC, and
    wherein a user accesses the IHS and the UCC using the first walk-in component.

6. The modular data center of claim 1, wherein the MITC is connected to an outdoor environmental control component (ECC) via an interposer, wherein the interposer comprises electrical, mechanical, and airflow connection components.

7. The modular data center of claim 1, wherein the MITC further comprises an indoor ECC.

8. The modular data center of claim 1,
    wherein the MITC is connected to an outdoor ECC, and
    wherein the MITC further comprises a second IHS.

* * * * *